(12) United States Patent
Kang et al.

(10) Patent No.: US 9,488,765 B2
(45) Date of Patent: Nov. 8, 2016

(54) WIRE GRID POLARIZER AND METHOD OF FABRICATING THE SAME

(71) Applicant: Samsung Display Co. Ltd., Yongin (KR)

(72) Inventors: Min Hyuck Kang, Seoul (KR); Hyeong Gyu Jang, Asan-si (KR); Eun Ae Kwak, Gunpo-si (KR); Moon Gyu Lee, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/924,423

(22) Filed: Oct. 27, 2015

(65) Prior Publication Data

US 2016/0274285 A1    Sep. 22, 2016

(30) Foreign Application Priority Data

Mar. 20, 2015 (KR) .................. 10-2015-0038600

(51) Int. Cl.
*H01L 27/14* (2006.01)
*G02B 5/30* (2006.01)
*H01L 27/12* (2006.01)

(52) U.S. Cl.
CPC ........... *G02B 5/3058* (2013.01); *H01L 27/124* (2013.01)

(58) Field of Classification Search
CPC ...................................................... H01L 27/124
USPC .................................................................. 257/72
See application file for complete search history.

(56) References Cited

U.S. PATENT DOCUMENTS

| 2014/0063467 A1* | 3/2014 | Takahashi | G02B 5/3058 353/20 |
| 2016/0033701 A1* | 2/2016 | Yang | G02B 5/3058 359/485.05 |

FOREIGN PATENT DOCUMENTS

| KR | 1020080024316 | 3/2008 |
| KR | 1020090001371 | 1/2009 |
| KR | 1020100080336 | 7/2010 |
| KR | 1020120033583 | 4/2012 |
| KR | 1020140013654 | 2/2014 |
| KR | 1020140030873 | 3/2014 |
| KR | 1020140074427 | 6/2014 |

\* cited by examiner

*Primary Examiner* — Douglas Menz
(74) *Attorney, Agent, or Firm* — Cantor Colburn LLP

(57) ABSTRACT

A wire grid polarizer includes a substrate, and a plurality of wire patterns which is arranged on the substrate at periodic intervals, where the wire patterns include first wire patterns, which are disposed on the substrate, and one or more second wire patterns, which are disposed on one or more of the first wire patterns each of the second wire patterns including at least one of a neutral pattern, a surface treatment pattern and first and second monomer block patterns.

20 Claims, 18 Drawing Sheets

FIG.2

WIRE GRID POLARIZER AND METHOD OF FABRICATING THE SAME

This application claims priority to Korean Patent Application No. 10-2015-0038600 filed on Mar. 20, 2015, and all the benefits accruing therefrom under 35 U.S.C. §119, the disclosure of which in its entirety is incorporated herein by reference.

BACKGROUND

1. Field

The invention relates to a wire grid polarizer and a method of fabricating the same.

2. Description of the Related Art

Polarizers, which control the polarization of light, are widely used in display devices such as liquid crystal display ("LCD") devices. Polarizers convert light of the natural state into single polarized light that travels straight.

To generate polarized light in an LCD device, a film-type polarizer may be used. The film-type polarizer may have a stack structure consisting of two triacetyl cellulose ("TAC") films and a polyvinyl alcohol ("PVA") film. The film-type polarizer, however, may be susceptible to deformation at high humidity and high-temperature.

To overcome the shortcomings of the film-type polarizer, a nano-wire grid polarizer, which has a metal pattern of a nano size on a glass substrate, has been spotlighted as an alternative to the film-type polarizer.

SUMMARY

Exemplary embodiments of the invention provide a method of fabricating a wire grid polarizer with no non-pattern area, a wire grid polarizer obtained by the method, and a display device including the wire grid polarizer.

However, exemplary embodiments of the invention are not restricted to those set forth herein. The above and other exemplary embodiments of the invention will become more apparent to one of ordinary skill in the art to which the invention pertains by referencing the detailed description of the invention set forth below.

According to an exemplary embodiment of the invention, a wire grid polarizer includes a substrate, and a plurality of wire patterns which is arranged on the substrate at periodic intervals, where the wire patterns include first wire patterns, which are disposed on the substrate, and one or more second wire patterns, which are disposed on one or more of the first wire patterns each of the second wire patterns having at least one of a neutral pattern, a surface treatment pattern and first and second monomer block patterns.

In an exemplary embodiment, the surface treatment pattern may be disposed between the neutral pattern and one of the first and second monomer block patterns.

In an exemplary embodiment, the surface treatment pattern may be further disposed on a side of at least one neutral pattern.

In an exemplary embodiment, the first wire patterns may include metal wire patterns, which reflect light.

According to an exemplary embodiment of the invention, a method of fabricating a wire grid polarizer includes sequentially forming a metal layer, a non-selective layer and a soft layer on a substrate, forming a soft pattern layer by patterning the soft layer, dividing the non-selective layer into a selective area and a non-selective area by using the soft pattern layer as a mask, applying a copolymer having two or more different monomers onto the non-selective layer, and forming a block copolymer having first monomer blocks and second monomer blocks by annealing the copolymer such that the monomers of the copolymer are aligned, where the forming the block copolymer includes forming a first block copolymer, which is aligned in a direction parallel to the surface of the selective area and a second block copolymer, which is aligned in a direction perpendicular to the surface of the non-selective area.

In an exemplary embodiment, the non-selective layer may have a surface, which is divided into areas with different selectivity properties, and controls an order of alignment of the first monomer blocks and the second monomer blocks.

In an exemplary embodiment, the dividing the non-selective area includes partially ashing the soft pattern layer and the non-selective layer to form a plurality of seed patterns and forming the selective area by forming a surface treatment layer on the surfaces of the seed patterns, and forming the non-selective area by washing the soft pattern layer to expose the surface of the non-selective area.

In an exemplary embodiment, the partially ashing the soft pattern layer and the non-selective layer may include performing oxygen ($O_2$) plasma treatment on the soft pattern layer and the non-selective layer.

In an exemplary embodiment, the seed patterns may be provided in at least one of a laterally-tapered shape, a semicircular shape and a rectangular shape in a cross-sectional view.

In an exemplary embodiment, the surface treatment layer may be hydrophilic to one of the monomers of the block copolymer.

In an exemplary embodiment, the surface treatment layer may include hydroxyl groups (OH—), which are disposed on the exposed surface of the non-selective layer.

In an exemplary embodiment, the surface treatment layer may control an order of alignment of the first monomer blocks and the second monomer blocks of the first block copolymer and the first block copolymer may induce an order of alignment of the first monomer blocks and the second monomer blocks of the second block copolymer.

In an exemplary embodiment, the seed patterns may be arranged on the surface of the non-selective layer at intervals of about 1 micrometer (μm) to about 5 μm.

In an exemplary embodiment, the non-selective layer may include a ketene-series compound, an azide-series compound and a combination thereof.

In an exemplary embodiment, the method of a wire grid polarizer may further include, after the forming the first block copolymer and the second block copolymer performing a first etching process of forming residual patterns by selectively removing parts of the first monomer blocks from the second block copolymer to form a height difference between the first monomer blocks and the second monomer blocks of the second block copolymer, and performing a second etching process of removing at least one of the metal layer, the non-selective layer, the surface treatment layer, the first monomer blocks and the second monomer blocks from below the residual patterns.

In an exemplary embodiment, the first etching process may use a chemical reactive gas including at least one of an oxygen gas, a fluorocarbon gas, hydrogen fluoride (HF) and a chlorine (Cl) gas.

In an exemplary embodiment, the residual patterns may be provided to cover the surface of the non-selective layer in the non-selective area.

In an exemplary embodiment, the second etching gas may use a non-reactive inert gas including at least one of a hydrogen (H) gas, an argon (Ar) gas, a helium (He) gas and a mixed gas thereof.

In an exemplary embodiment, the second etching process may form a plurality of wire patterns, including first wire patterns, which are provided by etching the metal layer, and one or more second wire patterns, which are disposed on one or more of the first wire patterns, each of the second wire patterns having at least one of a neutral pattern, which is provided by part of the non-selective layer that remains unetched, a surface treatment pattern, which is provided by part of the surface treatment layer that remains unetched, and first and second monomer block patterns, which are provided by parts of the first monomer blocks and the second monomer blocks that remain unetched.

According to an exemplary embodiment of the invention, a display device includes a protective layer which is disposed on a wire grid polarizer, gate lines which are disposed on the protective layer and extend in a first direction, data lines which are insulated from the gate lines and extend in a second direction, thin-film transistors ("TFTs") which are electrically connected to the gate lines and the data lines, and pixel electrodes which are electrically connected to the TFTs, where the wire grid polarizer includes a plurality of wire patterns, which are disposed on a substrate to protrude and are arranged at periodic intervals, and the wire patterns include first wire patterns, which are disposed on the substrate, and one or more second wire patterns, which are disposed on one or more of the first wire patterns, each of the second wire patterns having at least one of a neutral pattern, a surface treatment pattern and first and second monomer block patterns.

According to the exemplary embodiments, a method of fabricating a wire grid polarizer with no non-pattern area and a wire grid polarizer obtained by the method may be provided.

Other features and exemplary embodiments will be apparent from the following detailed description, the drawings, and the claims.

BRIEF DESCRIPTION OF THE DRAWINGS

The above and other exemplary embodiments, advantages and features of this invention will become more apparent by describing in further detail exemplary embodiments thereof with reference to the accompanying drawings, in which.

DETAILED DESCRIPTION

Figure 1:
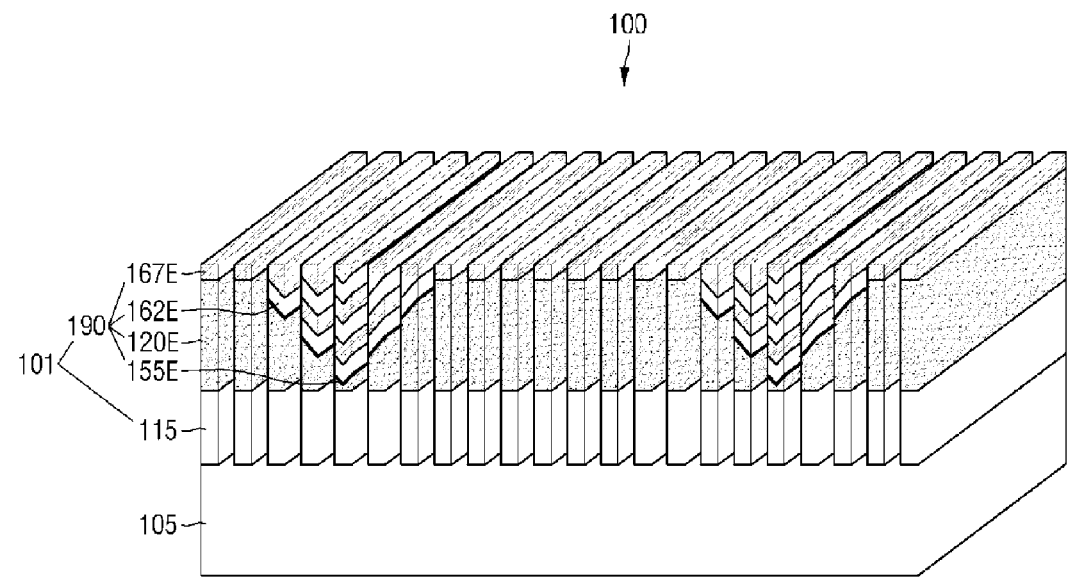
FIG. 1 is a perspective view of an exemplary embodiment of a wire grid polarizer according to the invention.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention is a part. Terms, such as those defined in commonly used dictionaries, should be interpreted as having a meaning that is consistent with their meaning in the context of the relevant art and will not be interpreted in an idealized or overly formal sense, unless expressly so defined herein.

Embodiments of the invention will now be explained with reference to the drawings. FIG. 1 is a perspective view of a wire grid polarizer according to an exemplary embodiment of the invention.

Referring to FIG. 1, a wire grid polarizer 100 includes a substrate 105 and a plurality of wire patterns 101, which protrude from the substrate 105 and are arranged side-by-side at periodic intervals.

The wire patterns 101 may include first wire patterns 115, which are disposed on the substrate 105, and second wire patterns 190, which are disposed on the first wire patterns 115. In an exemplary embodiment, the first wire patterns 115 and the second wire patterns 190 may both have the same width.

The first wire patterns 115 may be disposed on the substrate 105, and may include a metal material capable of reflecting some of the light provided to the wire grid polarizer 100. That is, light reflected by the first wire patterns 115 may be reflected again by a reflective plate through a variety of films, and may then be converted into P- or S-polarized waves to be emitted forward. Since recycled light repeats these processes indefinitely, the optical efficiency of the wire grid polarizer 100 may be improved.

In an exemplary embodiment, the first wire patterns 115 may include conductive wire patterns, and any conductive metal material may be used to form the first wire patterns 115. In an exemplary embodiment, the first wire patterns 115 may include a metal material. In an exemplary embodiment, the first wire patterns 115 may include a metal including one of aluminum (Al), chromium (Cr), gold (Au), copper (Cu), nickel (Ni), iron (Fe), tungsten (W), cobalt (Co), molybdenum (Mo) and any alloy thereof, but the invention is not limited thereto. In other exemplary embodiment, each of the first wire patterns 115 may include two or more layers.

The width of the first wire patterns 115 may be determined to be less than the distance between the wire patterns 101 and to guarantee proper polarization performance. In an exemplary embodiment, the width of the first wire patterns 115 may be in the range of about 10 nanometers (nm) to about 200 nm, for example, but the invention is not limited thereto. The second wire patterns 190, which are disposed on the first wire patterns 115, may have the same width as that of the first wire patterns 115.

In an exemplary embodiment, the thickness of the first wire patterns 115 may be in the range of about 10 nm to about 500 nm, for example, but the invention is not limited thereto.

One or more second wire patterns 190 may be disposed on one or more of the first wire patterns 115. Each of the second wire patterns 190 may include a neutral pattern 120E, which is disposed on at least one of the first wire patterns 115.

Each of the second wire patterns 190 may also include at least one of a surface treatment pattern 155E, a first monomer block pattern 162E and a second monomer block pattern 167E, which may be disposed on the neutral pattern 120E.

In an exemplary embodiment, a second wire pattern 190 including the neutral pattern 120E, which is disposed on at least one of the first wire patterns 115, may be provided. Accordingly, at least one of the wire patterns 101 may include a first wire pattern 115 and a second wire pattern 190 disposed on the first wire pattern 115 and including the neutral pattern 120E.

In an alternative exemplary embodiment, a second wire pattern 190 including the neutral pattern 120E, which is disposed on at least one of the first wire patterns 115, and a surface treatment pattern 155E, which is disposed on the neutral pattern 120E, may be provided. Accordingly, at least one of the wire patterns 101 may include a first wire pattern 115 and a second wire pattern 190 including the neutral pattern 120E and the surface treatment pattern 155E disposed on the first wire pattern 115.

In an alternative exemplary embodiment, a second wire pattern 190 including the neutral pattern 120E and the surface treatment pattern 155E, which are disposed on at least one of the first wire patterns 115, and a first or second monomer block pattern 162E or 167E, which is disposed on the surface treatment pattern 155E, may be provided. The surface treatment pattern 155E may be hydrophilic to the first or second monomer block pattern 162E or 167E.

In the description that follows, it is assumed that the first monomer block pattern 162E is hydrophilic to the surface treatment pattern 155E. Accordingly, at least one of the wire patterns 101 may include a first wire pattern 115 and a second wire pattern 190 including the neutral pattern 120E, the surface treatment pattern 155E and the first monomer block pattern 162E disposed on the first wire pattern 115.

In an alternative exemplary embodiment, a second wire pattern 190 including the neutral pattern 120E and the surface treatment pattern 155E, which are disposed on at least one of the first wire patterns 115, and the first monomer block pattern 162E and a second monomer block pattern 167E, which are disposed on the surface treatment pattern 155E, may be provided. In an exemplary embodiment, the first monomer block pattern 162E and the second monomer block pattern 167E may be repeatedly arranged. Accordingly, at least one of the wire patterns 101 may include a first wire pattern 115 and a second wire pattern 190 including the neutral pattern 120E, the surface treatment pattern 155E, the first monomer block pattern 162E, and the second monomer block pattern 167E disposed on the first wire pattern 115.

In an exemplary embodiment, the first monomer block pattern 162E and the second monomer block pattern 167E may be disposed in a diagonal shape, conforming to the shape of seed patterns 150 (refer to FIG. 5) provided during the fabrication of the wire grid polarizer 100. In an alternative exemplary embodiment, at least one first monomer block pattern 162E and at least one second monomer block pattern 167E included in at least one of the second wire patterns 190 may be provided in a chevron shape.

In response to the distance between the wire patterns 101 being smaller than the wavelength of electromagnetic waves incident upon the wire grid polarizer 100, polarized components parallel to the wire patterns 101, i.e., S waves, may be reflected by the wire grid polarizer 100, and polarized components perpendicular to the wire patterns 101, i.e., P waves, may be transmitted through the wire grid polarizer 100.

By using this phenomenon, a planar polarizer with an excellent polarization efficiency, a high transmissivity, and a wide viewing angle may be fabricated. The wire grid polarizer 100, unlike a linear polarizer, uses a metal as the material of the first wire patterns 115, and thus has a high reflection efficiency. Accordingly, the wire grid polarizer 100 reflects and recycles already-reflected light, and thus transforms all beams of light into single polarized light.

In an exemplary embodiment, the wire patterns 101 may be arranged side-by-side at periodic intervals. The smaller the distance between the wire patterns 101, the higher the polarization extinction ratio of the wire patterns 101 with respect to the wavelength of incident light. However, as the distance between the wire patterns 101 becomes smaller, it becomes more difficult to fabricate the wire patterns 101. In an exemplary embodiment, visible light generally falls within the range of wavelengths of about 380 nm to about 780 nm, for example. In an exemplary embodiment, in order for the wire grid polarizer 100 to have a high extinction ratio with respect to three primary colors of light (i.e., red R, green G and blue B), the conductive wire patterns may need to be provided to have a period of at least about 200 nm or less to provide adequate polarization performance, for example. In an exemplary embodiment, the wire patterns 101 may be provided to have a period of about 120 nm or less to offer at least as high a polarization performance as a related-art polarizer, but the invention is not limited thereto, for example.

The wire grid polarizer 100 may be provided to include the first wire patterns 115 and the second wire patterns 190. Accordingly, it is possible to fabricate a polarizer with no non-pattern area, and thus it is possible to improve the transmissivity and polarization characteristics of a polarizer.

A method of fabricating the wire grid polarizer according to the exemplary embodiment of FIG. 1, the invention will hereinafter be described.

FIGS. 2 to 11 are cross-sectional views illustrating a method of fabricating the wire grid polarizer according to the exemplary embodiment of FIG. 1.

Figure 2:
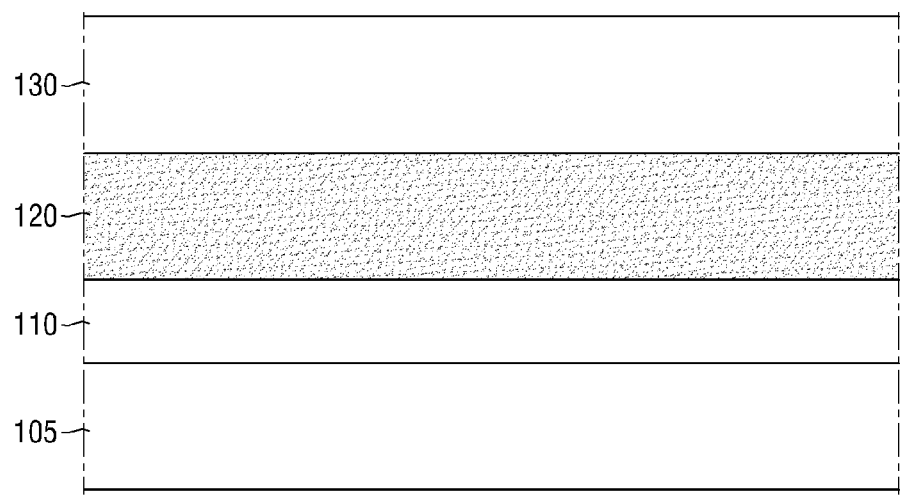
FIGS. 2 to 11 are cross-sectional views illustrating a method of fabricating the wire grid polarizer of the exemplary embodiment of FIG. 1.

Referring to FIG. 2, a metal layer 110 is disposed on the substrate 105, and a non-selective layer 120 is disposed on the metal layer 110. For consistency and a better understanding, the non-selective layer 120 will hereinafter be referred to as the neutral layer 120.

The material of the substrate 105 may be appropriately selected in consideration of the purpose of use of the substrate 105 and the type of processing that the substrate 105 is to be subjected, as long as it allows the substrate 105 to transmit visible light therethrough. In an exemplary embodiment, the substrate 105 may include various polymers such as glass, quartz, acrylic, triacetyl cellulose ("TAC"), a cyclic olefin copolymer ("COP"), a cyclic olefin polymer ("COC"), polycarbonate ("PC"), polyethylene naphthalate ("PET"), polyimide ("PI"), polyethylene naphthalate ("PEN"), polyethersulfone ("PES"), or polyacrylate ("PAR"), but the invention is not limited thereto. The substrate 105 may be implemented as an optical film material with a certain degree of flexibility.

The metal layer 110, which is disposed on the substrate 105, may include a metal material. In an exemplary embodiment, the metal layer 110 may include a metal including one of Al, Cr, Ag, Cu, Ni, titanium (Ti), Co, Mo and any alloy thereof, but the invention is not limited thereto.

The metal layer 110 may include two or more layers. In an exemplary embodiment, the metal layer 110 may include a first metal layer (not illustrated), which includes Al, and a second metal layer (not illustrated), which includes Ti or Mo, but the invention is not limited thereto. In response to the first metal layer including Al, hillocks may be generated during subsequent processes depending on the temperature of the subsequent processes. As a result, the top surface of the metal layer 110 may become uneven, and the optical properties of the wire grid polarizer 100 may deteriorate.

To prevent the generation of hillocks, the second metal layer may be disposed on the first metal layer using Ti or Mo. The metal layer 110 may include a metal that may be easily etched during a subsequent non-reactive plasma etching process.

In an exemplary embodiment, the metal layer 110 may be provided by sputtering, chemical vapor deposition ("CVD"), or evaporation, for example, but the invention is not limited thereto.

The neutral layer 120 is disposed on the metal layer 110.

In an exemplary embodiment, the neutral layer 120 may include a chemically neutral material with no such polarity as hydrophilicity or hydrophobicity. In an exemplary embodiment, the neutral layer 120 may include a cross-linkable neutral material.

The neutral layer 120 may align a block copolymer 160B (refer to FIG. 8) in a direction perpendicular to the surface thereof. That is, the neutral layer 120 may include a material with neutral polarity with respect to the block copolymer 160B (refer to FIG. 8) and may align first monomer blocks 162 (refer to FIG. 8) and second monomer blocks 167 (refer to FIG. 8) of the block copolymer 160B (refer to FIG. 8) in the direction perpendicular to the surface thereof.

In an exemplary embodiment, the neutral layer 120 may include one selected from a ketene-series combination and an azide-series combination, but the invention is not limited thereto.

In an exemplary embodiment, the neutral layer 120 may include a ketene-series combination, for example, represented by Formula 1:

In an alternative exemplary embodiment, the neutral layer 120 may include an azide-series combination, for example, represented by Formula 1:

where R is a substituent.

Thereafter, a soft layer 130 is disposed on the neutral layer 120. In an exemplary embodiment, the soft layer 130 may be a material layer such as a photoresist layer capable of forming a pattern. In an exemplary embodiment, the soft layer 130 may include a material with flowability, such as an organic material. In the description that follows, it is assumed that photoresist is used to form the soft layer 130, but the invention is not limited thereto. In an exemplary embodiment, the soft layer 130 may be provided by spin coating, slit coating, or gravure coating, for example, but the invention is not limited thereto.

Figure 3:
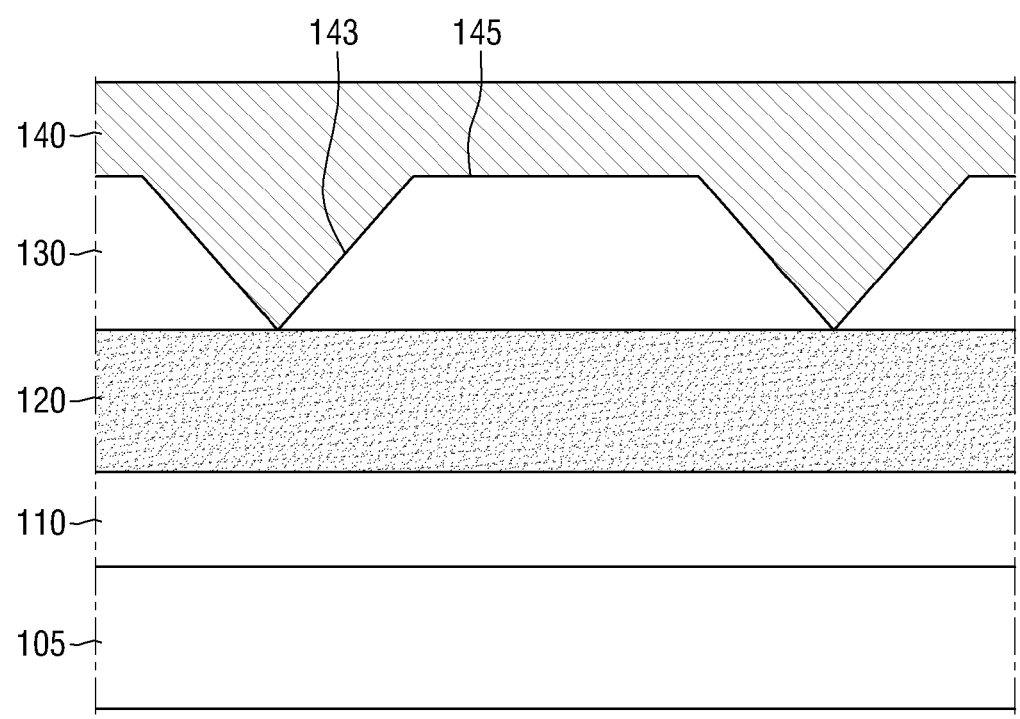
Figure 4:
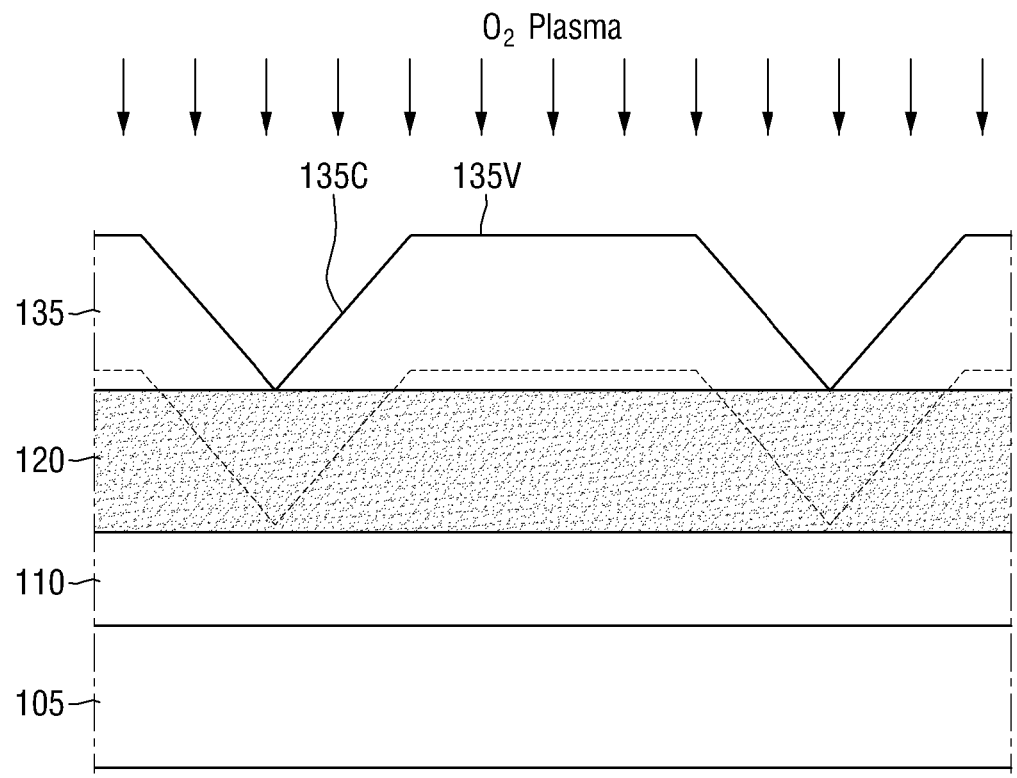

Referring to FIGS. 3 and 4, a soft pattern layer 135 is provided by patterning the soft layer 130.

In an exemplary embodiment, the soft pattern layer 135 may be provided by nano-imprint lithography ("NIL"), but the invention is not limited thereto. That is, the soft pattern layer 135 may also be provided by various other patterning methods such as photolithography and electron beam lithography.

The patterning of the soft layer 130 by NIL will hereinafter be described. A mold 140 with an embossed surface 143 and an engraved surface 145 is placed in contact with the soft layer 130. An osmotic phenomenon and a capillary phenomenon may occur in a direction of the surfaces of fine patterns disposed on the mold 140, and particularly, in a direction of the engraved surface 145. Due to the osmotic phenomenon and the capillary phenomenon, the material of the soft layer 130 may be transferred in the direction of the engraved surface 145.

The embossed surface 143 of the mold 140 that contacts the soft layer 130 may be partially hydrophobically treated. The hydrophobically-treated embossed surface 143 may facilitate the mass transition of the soft layer 130.

The material of the soft layer 130 may be transferred to the engraved surface 145 of the mold 140. Then, the mold 140 may be detached from the soft layer 130. As a result, the soft pattern layer 135 may be obtained.

In an exemplary embodiment, the soft pattern layer 135 may have a laterally tapered shape, for example, a semicircular shape or a rectangular shape, in a cross-sectional view, but the invention is not limited thereto. That is, the soft pattern layer 135 may be provided in various shapes as long as it may adequately form seed patterns 150 (refer to FIG. 5).

Figure 5:
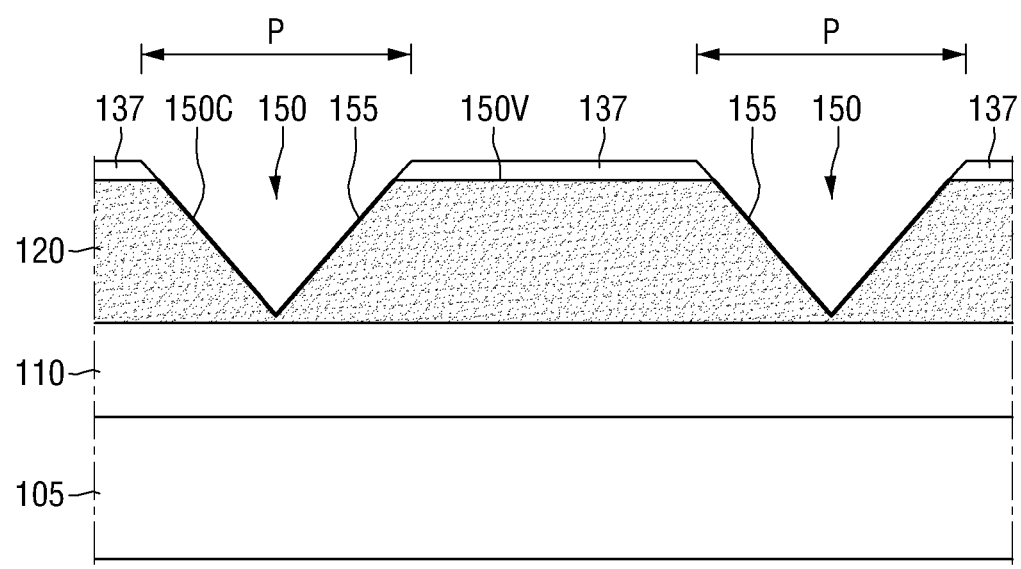

Referring to FIGS. 4 and 5, the neutral layer 120 may be partially removed by using the soft pattern layer 135 as a mask. During the removal of the neutral layer 120, the soft pattern layer 135 may also be partially removed.

In an exemplary embodiment, the soft pattern layer 135 and the neutral layer 120 may be partially removed by plasma treatment, for example, oxygen ($O_2$) plasma treatment using an oxygen gas as a source gas, but the invention is not limited thereto.

In an exemplary embodiment, the soft pattern layer 135 and the neutral layer 120 may be partially ashed by oxygen plasma treatment, for example. In the exemplary embodiment, by oxygen plasma treatment, the soft pattern layer 135 and the neutral layer 120 may be ashed to conform to the shape of the soft pattern layer 135.

In an exemplary embodiment, the soft pattern layer 135 and the neutral layer 120 may be ashed to the same thickness. That is, during the ashing of the soft pattern layer 135 and the neutral layer 120, the shape of the soft pattern layer 135 including embossed portions 135V and engraved portions 135C may be transferred onto the neutral layer 120.

The engraved portions 135C may be disposed closer than the embossed portions 135V to the neutral layer 120. Accordingly, the neutral layer 120 below the engraved portions 135C may be partially etched by the ashing of the soft pattern layer 135 and the neutral layer 120.

The ashing of the soft pattern layer 135 and the neutral layer 120 may be performed such that the embossed portions 135V of the soft pattern layer 135 may at least partially remain on the neutral layer 120 so as not to expose the neutral layer 120, and this will be described later in detail with reference to FIGS. 5 and 6.

Referring to FIG. 5, the seed patterns 150 are provided by partially removing the neutral layer 120. A surface treatment layer 155 may be disposed on the exposed surfaces of the seed patterns 150. To partition the neutral layer 120 into areas with different surface properties, the seed patterns 150 with the surface treatment layer 155 provided thereon may be provided in some area on the neutral layer 120.

The seed patterns 150 will hereinafter be described. The neutral layer 120 may be partially removed by plasma treatment, for example, and may thus be recessed in some area. Recessed parts of the neutral layer 120 may be defined as engraved regions 150C, and the other non-recessed parts of the neutral layer 120 that are relatively projected may be defined as embossed regions 150V. Patterns provided in the engraved regions 150C may become the seed patterns 150.

In response to the neutral layer 120 being partially removed to form the engraved regions 150C by an oxygen plasma treatment process, for example, oxygen plasma may continue to be provided to the surface of the neutral layer 120 exposed in the engraved regions 150C, and oxygen components provided during the oxygen plasma treatment process may react with the neutral layer 120 exposed in the seed patterns 150, thereby forming hydroxyl groups (OH—) on the exposed surface of the neutral layer 120. The hydroxyl groups may form the surface treatment layer 155 on the exposed surface of the neutral layer 120 in each of the seed patterns 150. The surface treatment layer 155 may be provided in the engraved regions 150C along the exposed surfaces of the seed patterns 150.

The hydroxyl groups that form the surface treatment layer 155 may serve as reactors for one of the monomers included in the block copolymer 160B. The surface treatment layer 155 may have selectivity with respect to one of the monomers included in the block copolymer 160B. In an exemplary embodiment, the surface treatment layer 155 may be hydrophilic to, and may thus easily combine with, one of the monomers included in the block copolymer 160B. In an alternative exemplary embodiment, a hydrophobic surface treatment layer may be provided. The surface treatment layer 155 may form a selective area P on the neutral layer 120. The selective area P will hereinafter be also referred to as a polar area P for a better understanding.

A residual soft pattern layer 137 may be disposed on the neutral layer 120 in the embossed regions 150V. The residual soft pattern layer 137 may serve as a mask for protecting the neutral layer 120 in the embossed regions 150V from oxygen plasma.

When no residual soft pattern layer 137 is provided in the embossed regions 150V, the neutral layer 120 in the embossed regions 150V may be exposed to oxygen plasma, and as a result, layers similar to the surface treatment layer 155 provided in the engraved regions 150C may be provided in the embossed regions 150V along the surface of the neutral layer 120. Accordingly, the neutral layer 120 may not be adequately divided into areas with different surface properties.

The shape and the arrangement of the seed patterns 150 will be described later in detail in connection with the block copolymer 160B.

Figure 6:
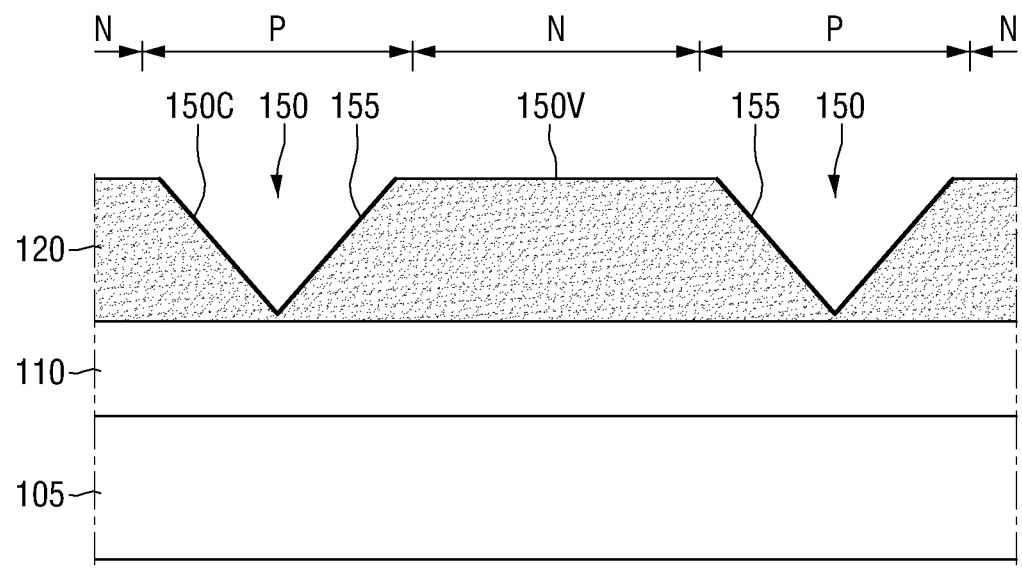

Referring to FIG. 6, the polar area P with the surface treatment layer 155 disposed thereon may be provided by performing oxygen plasma treatment on the neutral layer 120, for example, and the residual soft pattern layer 137 may then be removed from the embossed regions 150V through a wash-out process. That is, by removing the residual soft pattern layer 137, the surface of the neutral layer 120 in the embossed regions 150V may be exposed so as to form a non-selective area N. The non-surface treatment layer N will hereinafter be also referred to as a neutral area N for a better understanding.

By forming the seed patterns 150 with the surface treatment layer 155 in the engraved regions 150C, the polar area P may be provided on the neutral layer 120, and by removing the residual soft pattern layer 137 from the embossed regions 150V to expose the surface of the neutral layer 120, the neutral area N may be provided on the neutral layer 120. Accordingly, the neutral layer 120 may be divided into areas with different surface properties.

Figure 7:
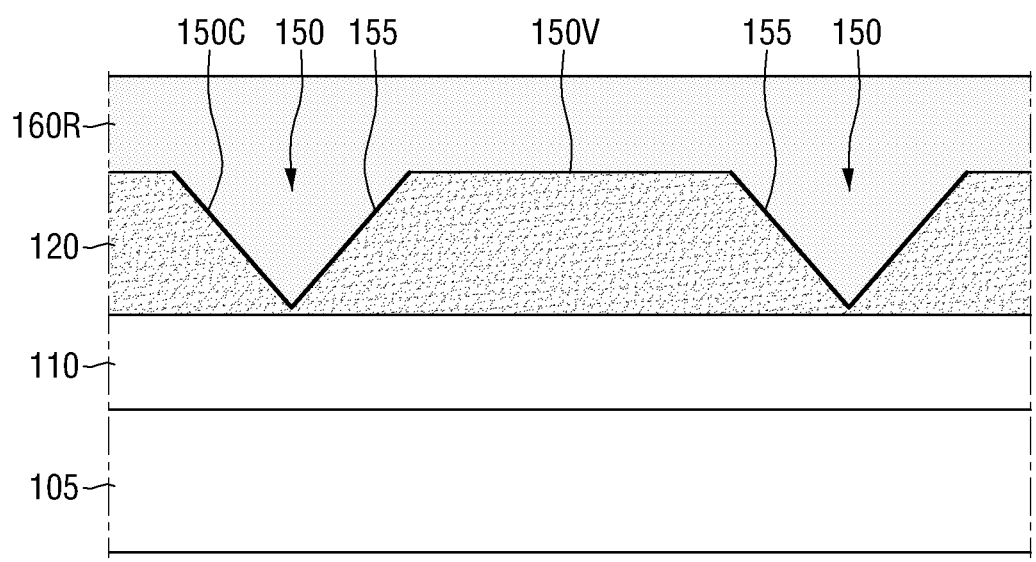

Referring to FIG. 7, a copolymer in which two or more different monomers 160R are disorderedly connected is applied onto the neutral layer 120, which is divided into the neutral area N and the polar area P.

Hereinafter, a copolymer in which two or more different monomers 160R will be referred to as "the copolymer 160R" to be differentiated from the block copolymer 160B.

In an exemplary embodiment, the copolymer 160R may include at least one of poly(styrene-r-methylmethacrylate) (PS-r-PMMA), poly(styrene-r-butadiene) (PS-r-PB), poly(styrene-r-isoprene) (PS-r-PI), poly(styrene-r-ethylene) (PS-r-PE), (poly(styrene-r-ethyleneoxide) (PS-r-PEO), poly(styrene-r-ferrocenyldimethylsilane) (PS-r-PFS), poly(styrene-r-(2-vinylpyridine)) (PS-r-P2VP) and poly(styrene-r-dimethylsiloxane) (PS-r-PDMS), for example.

In an exemplary embodiment, the copolymer 160R may be a polymer with a poly-dispersity index of 1.1 to 2 and a molecular weight of 10,000 or less, for example.

The copolymer 160R may be placed in contact with the neutral area N on the surface of the neutral layer 120 and the polar area P on the surface of the surface treatment layer 155. At least one of the monomers of the copolymer 160R may be hydrophilic to the surface treatment layer 155 in the engraved regions 150C. Accordingly, the arrangement of the copolymer 160R may be facilitated due to the hydrophilic properties of the copolymer 160R.

Figure 8:
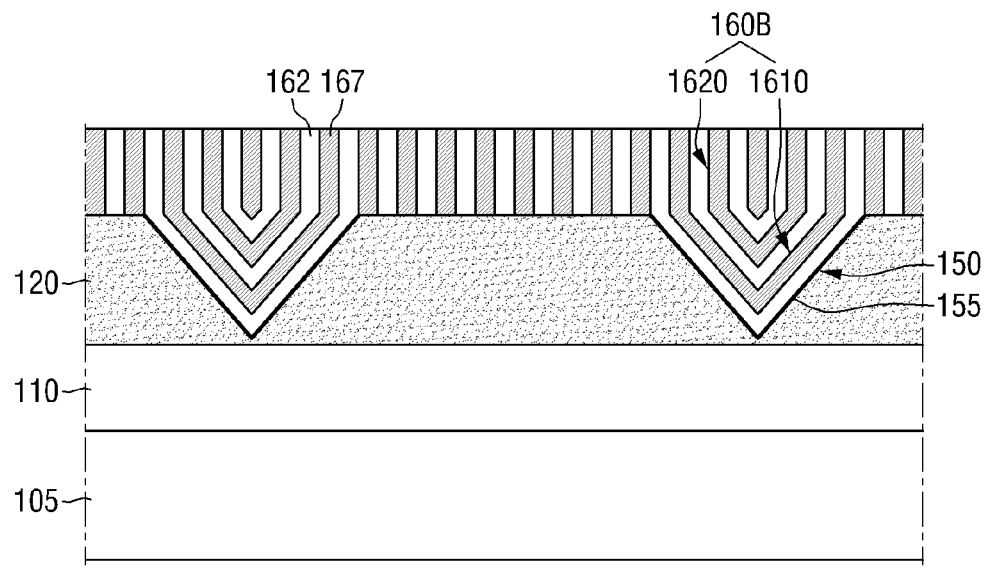

Referring to FIGS. 7 and 8, the monomers of the copolymer 160R may be aligned by annealing the copolymer 160R. The block copolymer 160B with blocks disposed therein is obtained by aligning the copolymer 160R. In an exemplary embodiment, the block copolymer 160B may be provided by thermal annealing, solvent annealing or the combination thereof, but the invention is not limited thereto.

Solvent annealing, which involves performing annealing in a chamber including a vaporized solvent, may reduce the amount of time that it takes to align the copolymer 160R and to cause phase separation of the copolymer 160R, compared to thermal annealing, but an appropriate annealing method may be chosen according to the whole process layout.

By annealing the copolymer 160R, the block copolymer 160B in which first monomer blocks 162 and second monomer blocks 167 having different hydrophilic or hydrophilic properties from the first monomer blocks 162 are alternately aligned may be provided. That is, the block copolymer 160B may be provided by allowing one monomer to be polymerized to form blocks while allowing another monomer to be polymerized to form other blocks. In an exemplary embodiment, the first monomer blocks 162 and the second monomer blocks 167 may be covalently bonded to each other.

The block copolymer 160B may include at least one of poly(styrene-b-methylmethacrylate) (PS-b-PMMA), poly(styrene-b-butadiene) (PS-b-PB), poly(styrene-b-isoprene) (PS-b-PI), poly(styrene-b-ethylene) (PS-b-PE), poly(styrene-b-ethyleneoxide) (PS-b-PEO), poly(styrene-b-ferrocenyldimethylsilane) (PS-b-PFS), poly(styrene-b-(2-vinylpyridine)) (PS-b-P2VP) and poly(styrene-b-dimethylsiloxane) (PS-b-PDMS), for example.

The block copolymer 160B may include a first block copolymer 1610 and a second block copolymer 1620, which have different directions of alignment with respect to the surface that they contact.

The first block copolymer 1610 may include monomers that are horizontally aligned with respect to its surface of contact with the selective area P. The surface treatment layer 155, which corresponds to the surface of the selective area P, may have predetermined polarity, such as hydrophilicity or hydrophobicity, with respect to a particular monomer. That is, the selective surface with polarity for the particular monomer may correspond to the polar area P.

In an exemplary embodiment, in the first block copolymer 1610, the first monomer blocks 162 and the second monomer blocks 167, which are aligned in a direction parallel to the surfaces of the seed patterns 150, may be repeatedly provided. The first monomer blocks 162 and the second monomer blocks 167 may be aligned on the surfaces of the seed patterns 150 where the surface treatment layer 155 is provided, i.e., in the polar area P, to be parallel to the surfaces of the seed patterns 150.

The second block copolymer 1620 where the first monomer blocks 162 and the second monomer blocks 167 are aligned in a direction perpendicular to the surface that they contact may be provided in the neutral area N. In an exemplary embodiment, in the second block copolymer 1620, the first monomer blocks 162 and the second monomer blocks 167 may be disposed vertically with respect to their surfaces of contact with the surface of the neutral layer 120. That is, the second block copolymer 1620 where the first monomer blocks 162 and the second monomer blocks 167 are vertically aligned with respect to their surfaces of contact with the surface of the neutral layer 120 may be disposed in the neutral area N.

The first block copolymer 1610 may be aligned in a horizontal direction with respect to the surface of the surface treatment layer 155 that the first block copolymer 1610 contacts, and the surface that the second block copolymer 1620 on the first block copolymer 1610 contacts may be the first block copolymer 1610.

The second block copolymer 1620 disposed on the first block copolymer 1610 may not be in contact with the surface of the surface treatment layer 155 or the surface of the neutral layer 120. An upper part of the first block copolymer 1610 where monomers are horizontally disposed with respect to the surface that the monomers contact may automatically form chemical patterns.

Due to the automatically-formed chemical patterns on the first block copolymer 1610, the second block copolymer 1620 on the first block copolymer 1610 may be vertically aligned with respect to its surface of contact with the first block copolymer 1610. That is, the second block copolymer 1620 on the first block copolymer 1610 may be aligned in the same direction as that of a neighboring second block copolymer 1620.

The block copolymer 160B may be aligned in different shapes depending on the properties of the surface that it contacts. That is, the second block copolymer 1620 on the first block copolymer 1610 may be vertically aligned with respect to the same surface of the neutral layer 120 as its neighboring second block copolymer 1620.

In an exemplary embodiment, the first monomer blocks 162 and the second monomer blocks 167 provided in the second block copolymer 1620 on the first block copolymer 1610 may be horizontally aligned with respect to the surfaces of the seed patterns 150 and may then be bent in an area where the second block copolymer 1620 is provided so as to be vertically aligned with respect to the surface of the neutral layer 120 as in the second block copolymer 1620 in the neutral area N.

Figure 18:
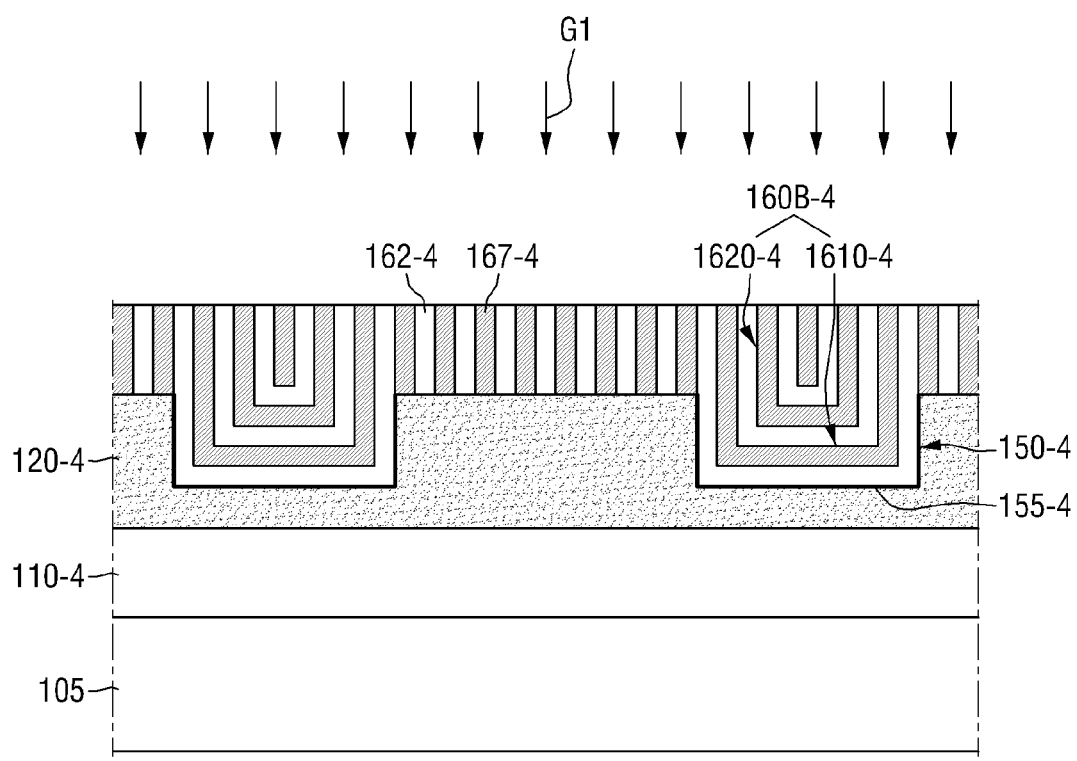

The first monomer blocks 162 and the second monomer blocks 167 may be bent in various manners or shapes, other than that set forth herein, depending on the shape of the seed patterns 150. In an exemplary embodiment, the first monomer blocks 162 and the second monomer blocks 167 of the first block copolymer 1610 or the second block copolymer 1620 may be bent in the seed patterns 150, as illustrated in FIG. 18.

The block copolymer 160B may control the order in which the first monomer blocks 162 and the second monomer blocks 167 are aligned by using the neutral layer 120, which is divided into areas with different surface properties.

In an exemplary embodiment, the copolymer 160R may be disposed to contact the neutral area N and the polar area P. Initially, the copolymer 160R, which includes two or more different monomers, is disorderedly distributed without forming any particular patterns. In response to an annealing process being performed on the copolymer 160R with two or more different monomers so as to impart flexibility and mobility to the polymer chains, molecular flows may be generated, and uniform patterns may be provided.

One of the monomers of the copolymer 160R in contact with the polar area P may have hydrophilic properties with respect to the surface treatment layer 155 in the polar area P. Accordingly, one of the monomers of the copolymer 160R in the polar area P is more likely than the corresponding monomer of the copolymer 160R on the neutral layer 120 to react with the hydrophilicity of the surface treatment layer 155, and thus more likely to cause molecular flows.

Therefore, the order in which to align the monomers of the copolymer 160R in the polar area P may be determined by the surface treatment layer 155 in the seed patterns 150, and the monomers of the copolymer 160R in the polar area P may be aligned according to the determined order. That is, the first block copolymer 1610 may be aligned first, and the second block copolymer 1620 on the first block copolymer 1610 may then be aligned, thereby inducing the alignment of the second block copolymer 1620 on the neutral layer 120.

That is, since the first block copolymer 1610 may induce the alignment of the second block copolymer 1620, the second block copolymer 1620 may be self-aligned by the first block copolymer 1610.

In an exemplary embodiment, in order for the first block copolymer 1610 to self-align the second block copolymer 1620, the seed patterns 150 may be arranged at intervals of about 1 micrometer (μm) to about 5 μm, for example. In an exemplary embodiment, when the distance between the seed patterns 150 is less than about 1 μm, the surface treatment layer 155, which has hydrophilic properties with respect to particular monomers, may be too close to each other to properly align the second block copolymer 1620 in a vertical direction with respect to the surface of the neutral layer 120, for example.

In an exemplary embodiment, when the distance between the seed patterns 150 is greater than about 5 μm, the surface treatment layer 155 may be too distant from one another to cause self-alignment of the second block copolymer 1620. That is, the second block copolymer 1620 may not be provided uniformly.

In an exemplary embodiment, the seed patterns 150 where the surface treatment layer 155 is provided may be provided to a width of about 200 nm to about 2 μm, for example. In an exemplary embodiment, four periods of first and second monomer blocks 162 and 167 may be disposed in each of the seed patterns 150, and the seed patterns 150 may be provided to a width of about 200 nm to about 2 μm depending on the thicknesses of the first and second monomer blocks 162 and 167, for example. However, the invention is not limited to this example.

In the exemplary embodiment of FIG. 1, the block copolymer 160B is self-aligned by the seed patterns 150. Accordingly, the block copolymer 160B may be aligned without the need of an additional non-pattern area.

That is, the block copolymer 160B may be aligned without a requirement of trimming for forming patterns of a similar size to monomer blocks or multiple patterning such as double patterning. Also, the seed patterns 150 may be disposed on the substrate 105 with ease, and as a result, the block copolymer 160B may form large-scale nano-patterns.

Figure 9:
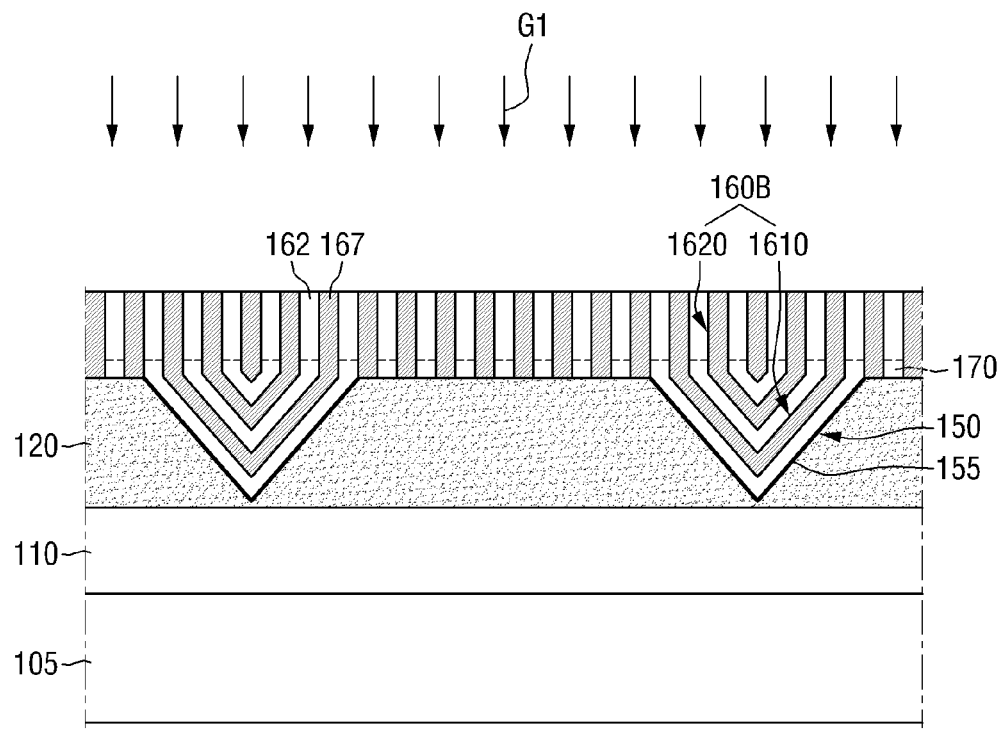

Referring to FIG. 9, the first monomer blocks 162 or the second monomer blocks 167, which have a different etching rate from the first monomer blocks 162, are selectively removed. In the description that follows, it is assumed that the first monomer blocks 162, which have a relatively higher etching rate than the second monomer blocks 167, are selectively removed.

To selectively remove the first monomer blocks 162 with a relatively high etching rate, a dry etching process may be performed, for example. A first etching process using a first etching gas G1 may be performed as the dry etching process, but the invention is not limited thereto.

During the first etching process using the first etching gas G1, the first monomer blocks 162 with a relatively high etching rate may be selectively removed using a chemical reactive gas. In an exemplary embodiment, the first etching gas G1 may be at least one reactive gas including at least one of an oxygen gas, a fluorocarbon gas, hydrogen fluoride (HF) and a chlorine (Cl) gas, for example, but the invention is not limited thereto. In an exemplary embodiment, the fluorocarbon gas may include at least one of, for example, C4F8, CHF3, CH2F2, C4F8, CF4 and C2F6, but the invention is not limited thereto.

During the first etching process, the first monomer blocks 162 may be etched so as not to etch the surface treatment layer 155, which is disposed to contact the first block copolymer 1610. In the neutral area N, the first monomer blocks 162 may be etched to the extent that the surface of the neutral layer 120 is not exposed.

The first monomer blocks 162 may be selectively etched by the first etching gas G1.

Parts of the first monomer blocks 162 that remain unetched on the second block copolymer 1620 may form residual patterns 170 on the surface of the neutral layer 120.

The residual patterns 170 may be provided to cover the surface of the neutral layer 120 in the neutral area N. The first block copolymer 1610 may be disposed below the residual patterns 170. The first block copolymer 1610 includes monomer blocks disposed on the seed patterns 150. Accordingly, when an etching process for selectively etching the first monomer blocks 162 is continued, the first monomer blocks 162 of the first block copolymer 1610 on the seed patterns 150 may also be removed. However, when the first monomer blocks 162 aligned in parallel to their surfaces of contact with the seed patterns 150 are removed, the block copolymer 160B may no longer be able to be arranged at periodic intervals over the seed patterns 150.

Accordingly, the residual patterns 170, which are obtained by etching the first monomer blocks 162 to the extent that the surface of the neutral layer 120 may be covered with the first monomer blocks 162, may be provided. Since the residual patterns 170 are provided to have the same size not only in the neutral area N, but also in the polar area P, the first monomer blocks 162 disposed in the seed patterns 150, among other first monomer blocks 162 disposed in the polar area P, may be protected from the first etching gas G1, and may thus remain unetched.

The pattern of arrangement of the first block copolymer 1610 on the seed patterns 150 may be protected by the residual patterns 170, and as a result, the shape of the second block copolymer 1620 on the first block copolymer 1610 may be maintained.

The residual patterns 170 may be provided by appropriately adjusting conditions associated with the first etching gas G1. The conditions associated with the first etching gas G1 may include the duration for which to expose the first monomer blocks 170 to the first etching gas G1 and the amount of the first etching gas G1, but the invention is not limited thereto.

During the formation of the residual patterns 170, the second monomer blocks 167 may also be partially etched upon exposure to the first etching gas G1.

Due to the presence of the residual patterns 170, which are provided by selectively etching the first monomer blocks 162 of the block copolymer 160B, a difference in height between the residual patterns 170 and the second monomer blocks 167 may be provided. The height difference between the residual patterns 170 and the second monomer blocks 167 may be determined by the applied thickness of the copolymer 160R (refer to FIG. 7) and is thus not particularly limited.

In short, the residual patterns 170 may be provided by selectively etching the first monomer blocks 162 with the use of the first etching gas G1, which is a reactive gas, and a height difference may be provided between the residual patterns 170 and the second monomer blocks 167. Accordingly, a plurality of trenches may be provided among the second monomer blocks 167, which are repeatedly arranged.

Figure 10:
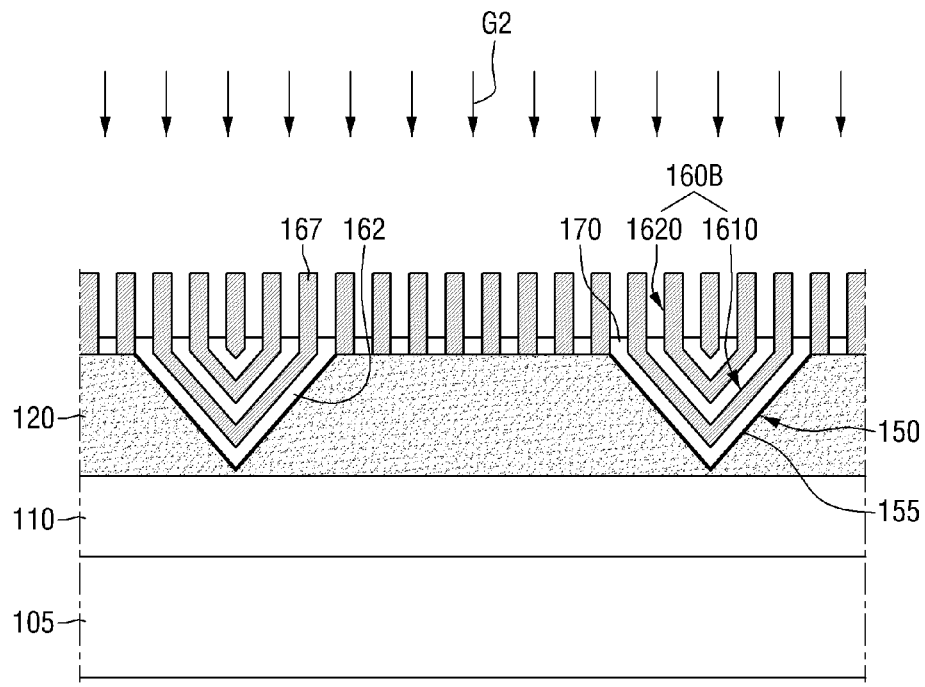

Referring to FIG. 10, the residual patterns 170 and at least one of the neutral layer 120, the metal layer 110, the first monomer blocks 162, the second monomer blocks 167 and the surface treatment layer 155 may be etched with physical energy by providing a second etching gas G2 to the substrate 105 with a height difference between the residual patterns 170 and the second monomer blocks 167. During the etching of multiple layers from below the residual patterns 170, the second monomer blocks 167 may also be partially etched upon exposure to the second etching gas G2.

In an exemplary embodiment, the second etching gas G2 may be a non-reactive gas, and an inert gas with small reactivity, such as a hydrogen (H) gas, an argon (Ar) gas, a helium (He) gas and any mixed gas thereof may be used as the second etching gas G2.

In an exemplary embodiment, the residual patterns 170 and at least one of the neutral layer 120, the metal layer 110, the first monomer blocks 162, the second monomer blocks 167 and the surface treatment layer 155 below the residual patterns 170 may be etched with physical energy by using the second etching gas G2, which is a non-reactive gas.

When the etching of the residual patterns 170 using the second etching gas G2 is continued to etch the metal layer 110, at least one of the neutral layer 120, which is disposed on the metal layer 110, the metal layer 110, the first monomer blocks 162, the second monomer blocks 167, and the surface treatment layer 155 may also be etched. Accordingly, when the etching of the residual patterns 170 the second etching gas G2 is continued to reach and etch the metal layer 110, multiple patterns may be disposed on the etched metal layer 110.

Since parts of the second monomer blocks 167 that are exposed to the second etching gas G2 are etched, the height of the block copolymer 160B may be generally reduced.

Figure 11:
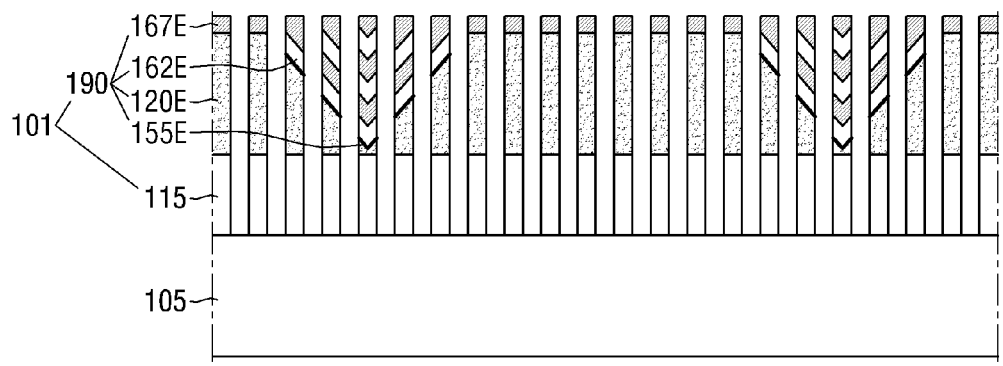

Referring to FIG. 11, and further to FIG. 1, a wire grid polarizer 100 with a plurality of wire patterns 101 may be obtained by performing etching on the substrate 105 such that not only at least one of the neutral layer 120, the surface treatment layer 155, the first monomer blocks 162 and the second monomer blocks 167, which are disposed on the substrate 105, but also the metal layer 110, may be etched.

The wire patterns 101 may include first wire patterns 115, which are periodic patterns obtained by etching the metal layer 110. In an exemplary embodiment, the first wire patterns 115 may be conductive wire patterns including a metal.

The substrate 105 where at least one of the metal layer 110, the neutral layer 120, the surface treatment layer 155, the first monomer blocks 162 and the second monomer blocks 167 are provided may be etched by the second etching gas G2, and parts of the metal layer 110, the neutral layer 120, the surface treatment layer 155, the first monomer blocks 162 and the second monomer blocks 167 that remain unetched may form one or more second wire patterns 190 on one or more of the first wire patterns 115.

Each of the second wire patterns 190 may include a neutral pattern 120E, which is disposed on at least one of the first wire patterns 115. At least one of the second wire patterns 190 may also include at least one of a surface treatment pattern 155E, a first monomer block pattern 162E and a second monomer block pattern 167E, which are disposed on the neutral pattern 120E.

In an exemplary embodiment, the wire grid polarizer 100 may include a second wire pattern 190 including the neutral pattern 120E, which is disposed on at least one of the first wire patterns 115. Accordingly, at least one of the wire patterns 101 may include a first wire pattern 115 and a second wire pattern 190 including the neutral pattern 120E, which is disposed on the first wire pattern 115.

In an alternative exemplary embodiment, a second wire pattern 190 including the neutral pattern 120E, which is disposed on at least one of the first wire patterns 115, and the surface treatment pattern 155E, which is disposed on the neutral pattern 120E, may be provided. Accordingly, at least one of the wire patterns 101 may include a first wire pattern 115 and a second wire pattern 190 including the neutral pattern 120 and the surface treatment pattern 155E disposed on the first wire pattern 115.

In an alternative exemplary embodiment, a second wire pattern 190 including the neutral pattern 120E and the surface treatment pattern 155E, which are disposed on at least one of the first wire patterns 115, and the first or second monomer block pattern 162E or 167E, which is disposed on the surface treatment pattern 155E, may be provided. The surface treatment pattern 155E may be hydrophilic to the first or second monomer block pattern 162E or 167E. In the description that follows, it is assumed that the first monomer block pattern 162E is hydrophilic to the surface treatment pattern 155E.

Accordingly, at least one of the wire patterns 101 may include a first wire pattern 115 and a second wire pattern 190 including the neutral pattern 120E, the surface treatment pattern 155E and the first monomer block pattern 162E disposed on the first wire pattern 115.

In an alternative exemplary embodiment, a second wire pattern 190 including the neutral pattern 120E and the surface treatment pattern 155E, which are disposed on at least one of the first wire patterns 115, and the first monomer block pattern 162E and the second monomer block pattern 162E and 167E, which are disposed on the surface treatment pattern 155E, may be provided. The first monomer block pattern 162E and the second monomer block pattern 167E may be repeatedly arranged.

Accordingly, at least one of the wire patterns 101 may include a first wire pattern 115 and a second wire pattern 190 including at least one of the neutral pattern 120E, the surface treatment pattern 155E, the first monomer block pattern 162E, and the second monomer block pattern 167E disposed on the first wire pattern 115.

In an exemplary embodiment, the first monomer block pattern 162E and the second monomer block pattern 167E may be provided in a diagonal shape, for example, conforming to the shape of the seed patterns 150. In an alternative exemplary embodiment, in at least one of the second wire pattern 190, the first monomer block pattern 162E and the second monomer block pattern 167E may be provided in a chevron shape, for example.

In the exemplary embodiment of FIG. 1, the seed patterns 150 provide different polarity areas on the surface of the neutral layer 120, and as a result, the block copolymer 160B may be self-aligned on the neutral layer 120. Accordingly, the exemplary embodiment of FIG. 1 may be applied to large-scale processing, and may provide a wire grid polarizer with nano patterns on the entire surface thereof without the need to form a non-pattern area on the wire grid polarizer.

Also, in the exemplary embodiment of FIG. 1, the surface of the neutral layer 120 is treated to have different polarities from one area to another area, and thus, there is no need to form a non-pattern area. Accordingly, the transmissivity and polarization properties of a wire gird polarizer may be improved.

Also, there is no need to perform additional processes, such as trimming for forming patterns of a similar size to the wire patterns 101 or double patterning, to form the block copolymer 160B. Accordingly, the fabrication of a wire grid polarizer may be facilitated.

Figure 12:
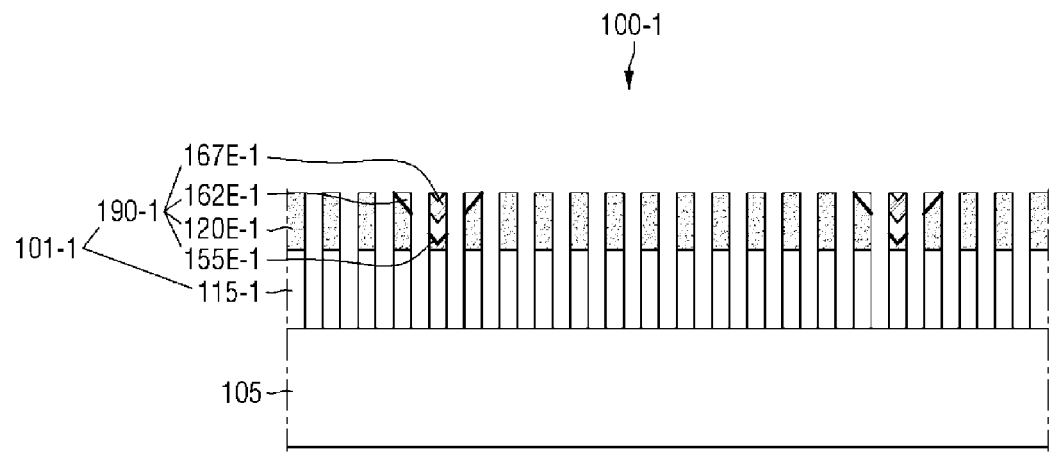
FIG. 12 is a cross-sectional view of a variation of the wire grid polarizer according to the exemplary embodiment of FIG. 1.
Figure 13:
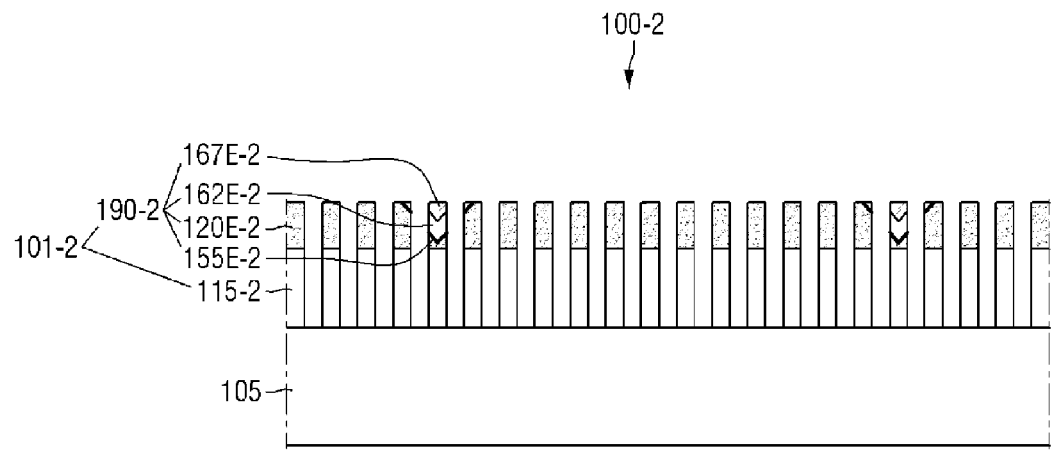
FIG. 13 is a cross-sectional view of another variation of the wire grid polarizer of the exemplary embodiment of FIG. 1.
Figure 14:
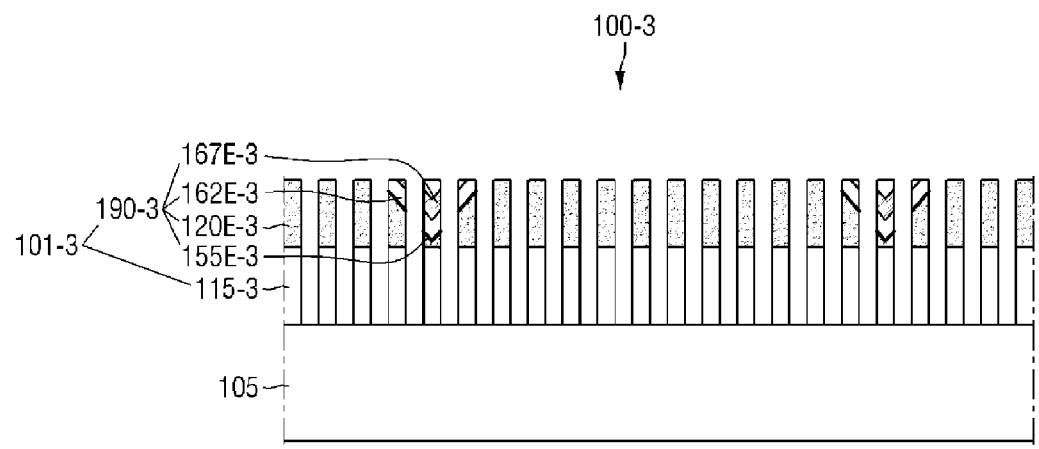
FIG. 14 is a cross-sectional view of another variation of the wire grid polarizer of the exemplary embodiment of FIG. 1.

FIG. 12 is a cross-sectional view of a variation of the wire grid polarizer according to the exemplary embodiment of FIG. 1, FIG. 13 is a cross-sectional view of another variation of the wire grid polarizer according to the exemplary embodiment of FIG. 1, and FIG. 14 is a cross-sectional view of another variation of the wire grid polarizer according to the exemplary embodiment of FIG. 1.

In FIGS. 1 to 14, like reference numerals indicate like elements, and thus, descriptions thereof will be omitted or simplified.

Referring to FIG. 12, 13 or 14, the extent to which first monomer blocks 162, second monomer blocks 167 and a neutral layer 120 of a wire grid polarizer 100-1, 100-2, or 100-3 are etched during a second etching process using a second etching gas G2 may increase depending on the amount of exposure to the second etching gas G2 (refer to FIG. 10).

That is, in the wire grid polarizer 100-1, 100-2 or 100-3, the height of wire patterns 101-1, 101-2 or 101-3, and particularly, the height of second wire patterns 190-1, 190-2 or 190-3 may be adjusted by adjusting the amount by which the second wire patterns 190-1, 190-2 or 190-3 is etched, respectively. Also, the shape of patterns that are exposed on the wire patterns 101-1, 101-2 or 101-3 of the wire grid polarizer 100-1, 100-2 or 100-3, respectively, may vary depending on the amount by which the second wire patterns 190-1, 190-2 or 190-3 is etched, respectively.

Referring to the wire grid polarizer 100-1 of FIG. 12, a first monomer block pattern 162E-1, a second monomer block pattern 167E-1 and a surface treatment pattern 155E-1 may be disposed on at least one of the second wire patterns 190-1 of the wire patterns 101-1. A neutral pattern 120E-1 may be disposed on the first wire pattern 115-1

The first monomer block pattern 162E-1 and the surface treatment pattern 155E-1 may be disposed on at least one of the second wire patterns 190-1 so that the surface treatment pattern 155E-1 may be exposed on one side of the first monomer block pattern 162E-1.

The surface treatment pattern 155E-1 may be disposed between the first monomer block pattern 162E-1 and a neutral layer pattern 120E-1, and may be disposed to extend from one side to the other side of at least one of the second wire patterns 190-1. That is, the surface treatment pattern 155E-1 may be disposed in a diagonal direction with respect to the surface of a substrate 105. The surface treatment pattern 155E-1 may be exposed at one side of the top of at least one of the second wire patterns 190-1.

Accordingly, the first monomer block pattern 162E-1 and the surface treatment pattern 155E-1, which is disposed on one side of the first monomer block pattern 162E-1, may be disposed and exposed on the surface of at least one of the second wire patterns 190-1. The neutral pattern 120E-1, the surface treatment pattern 155E-1 and the first monomer block pattern 162E-1 may be sequentially deposited on, and exposed on the sides of, at least one of the second wire patterns 190-1.

The first monomer block pattern 162E-1, which is triangular in a cross-sectional view, for example, may be disposed on one surface of the surface treatment pattern 155E-1. The neutral pattern 120E-1, which is trapezoidal in a cross-sectional view, may be disposed on the other surface of the surface treatment pattern 155E-1.

Referring to the wire grid polarizer 100-2 of FIG. 13, the neutral pattern 120E-2, which is a portion of a neutral layer 120 that remains unetched, may be provided and exposed on each of the wire patterns 101-2. The neutral pattern 120E-2 may be disposed on the first wire pattern 115-2.

A first monomer block pattern 162E-2, a second monomer block pattern 167E-2, a surface treatment pattern 155E-2 and the neutral pattern 120E-2 may be disposed and exposed on at least one of the second wire patterns 190-2.

In an exemplary embodiment, the surface treatment pattern 155E-2 may be disposed between the first monomer block pattern 162E-2 and the neutral pattern 120E-2 at the top portion of at least one of the second wire patterns 190-2, and may be exposed.

The neutral pattern 120E-2, the surface treatment pattern 155E-2 and the first monomer block pattern 162E-2 may be sequentially deposited on, and exposed on the sides of, at least one of the second wire patterns 190-2.

The surface treatment pattern 155E-2 may be disposed between the first monomer block pattern 162E-2 and the neutral pattern 120E-2 along a diagonal direction with respect to the surface of a substrate 105. Accordingly, the surface treatment pattern 155E-2 may be deposited on, and exposed on the sides of, at least one of the second wire patterns 190-2.

The first monomer block pattern 162E-2, which is triangular in a cross-sectional view, for example, may be disposed on one surface of the surface treatment pattern 155E-2. The neutral pattern 120E-2, which has a slanted side and has the top surface thereof partially exposed, may be disposed on the other surface of the surface treatment pattern 155E-2.

Referring to the wire grid polarizer 100-3 of FIG. 14, a first monomer block pattern 162E-3 and a second monomer block pattern 167E-3 may be disposed on at least one of the second wire patterns 190-3 of the wire patterns 101-3. A neutral pattern 120E-3 may be disposed on the first wire pattern 115-3

The first monomer block pattern 162E-3 and the second monomer block pattern 167E-3 may be exposed at the top surface of at least one of the second wire patterns 190-3.

A surface treatment pattern 155E-3 may be disposed between the first monomer block pattern 162E-3 and a neutral pattern 120E-3, and may extend from one side to the other side of at least one of the second wire patterns 190-3. That is, the surface treatment pattern 155E-3 may be disposed in a diagonal direction with respect to the surface of a substrate 105.

Accordingly, the first monomer block pattern 162E-3 and the second monomer block pattern 167E-3 may be disposed and exposed on at least one of the second wire patterns 190-3, and the neutral pattern 120E-3, the surface treatment pattern 155E-3, the first monomer block pattern 162E-3 and the second monomer block pattern 167E-3 may be sequentially deposited on, and exposed on the sides of, at least one of the second wire patterns 190-3.

According to the exemplary embodiment of FIG. 1 and the variations to the exemplary embodiment of FIG. 1, as illustrated in FIGS. 12 to 14, the wire patterns 101, 101-1, 101-2, or 101-3 may be provided in various shapes by adjusting the amount by which the second wire patterns 190, 190-1, 190-2, or 190-3 of the wire patterns 101, 101-1, 101-2, or 101-3 is etched, respectively.

Figure 15:
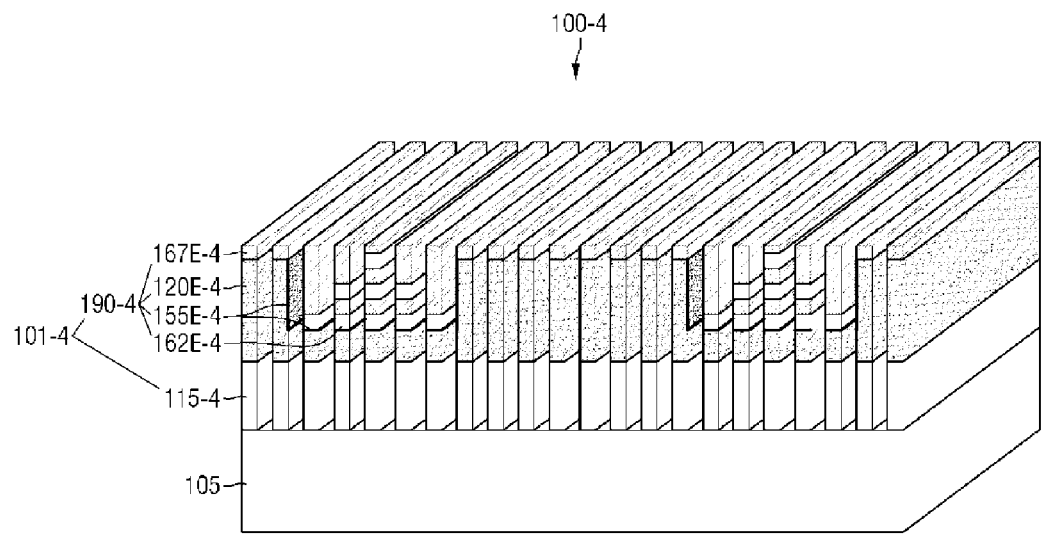
FIG. 15 is a perspective view of another exemplary embodiment of a wire grid polarizer according to the invention.

FIG. 15 is a perspective view of a wire grid polarizer according to another exemplary embodiment of the invention, and FIGS. 16 to 20 are cross-sectional views illustrating a method of fabricating the wire grid polarizer according to the exemplary embodiment of FIG. 15. The illustrated exemplary embodiment will hereinafter be described with reference to FIGS. 15 to 20, and further reference to FIGS. 1 to 14. In FIGS. 1 to 20, like reference numerals indicate like elements, and thus, descriptions thereof will be omitted or simplified.

Referring to FIG. 15, a wire grid polarizer 100-4 may include a plurality of wire patterns 101-4, which are disposed on a substrate 105 to protrude.

The wire patterns 101-4 may include first wire patterns 115-4, which protrude from the substrate 105, and one or more second wire patterns 190-4, which are disposed on one or more of the first wire patterns 115-4. Each of the second patterns 190-4 may include at least one of a neutral pattern 120E-4, a surface treatment pattern 155E-4, a first monomer block pattern 162E-4 and a second monomer block pattern 167E-4, which may be disposed on at least one of the first wire patterns 115-4.

In the illustrated exemplary embodiment, a plurality of seed patterns 150-4 (refer to FIG. 17) may be rectangular with respect to a cross section of a neutral layer 120-4, for example. Accordingly, in at least one of the second wire patterns 190-4, the neutral pattern 120E-4, the surface treatment pattern 155E-4, the first monomer block pattern 162E-4 and the second monomer block pattern 167E-4 may form stripes in a cross-sectional view, for example.

That is, the neutral pattern 120E-4, the surface treatment pattern 155E-4, the first monomer block pattern 162E-4 and the second monomer block pattern 167E-4 may be provided to extend in parallel to a cross section perpendicular to the deposition surface of at least one of the first wire patterns 115-4.

In at least one of the second wire patterns 190-4, the surface treatment pattern 155E-4 may be disposed on one side of the neutral pattern 120E-4.

The wire grid polarizer 100-4 may include the first wire patterns 115-4 and the second wire patterns 190-4, which are disposed in parallel to a cross section perpendicular to the deposition surfaces of the first wire patterns 115-4. Accordingly, it is possible to fabricate a polarizer with no non-pattern area and thus to improve the transmissivity and polarization characteristics of a polarizer.

A method of fabricating the wire grid polarizer according to the exemplary embodiment of FIG. 15 will hereinafter be described.

Figure 16:
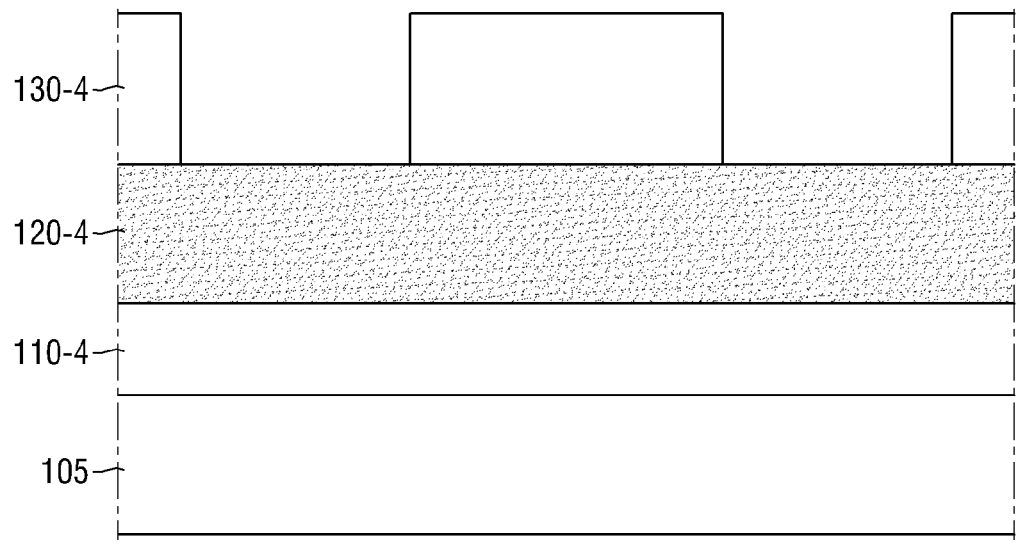
FIGS. 16 to 20 are cross-sectional views illustrating a method of fabricating the wire grid polarizer of the exemplary embodiment of FIG. 15.

Referring to FIG. 16, a metal layer 110-4 is disposed on the substrate 105, and a neutral layer 120-4 is disposed on the metal layer 110-4. A soft layer is disposed on the neutral layer 120-4, and a soft pattern layer 130-4 is provided by patterning the soft layer. The soft pattern layer 130-4 may be provided to partially expose and partially cover the neutral layer 120-4 disposed therebelow. In an exemplary embodiment, the neutral layer 120-4 may include a ketene-series compound, an azide-series compound and a combination thereof.

The soft pattern layer 130-4 may form patterns that are rectangular in a cross-sectional view with respect to the deposition surfaces of the metal layer 110-4 and the neutral layer 120-4.

Figure 17:
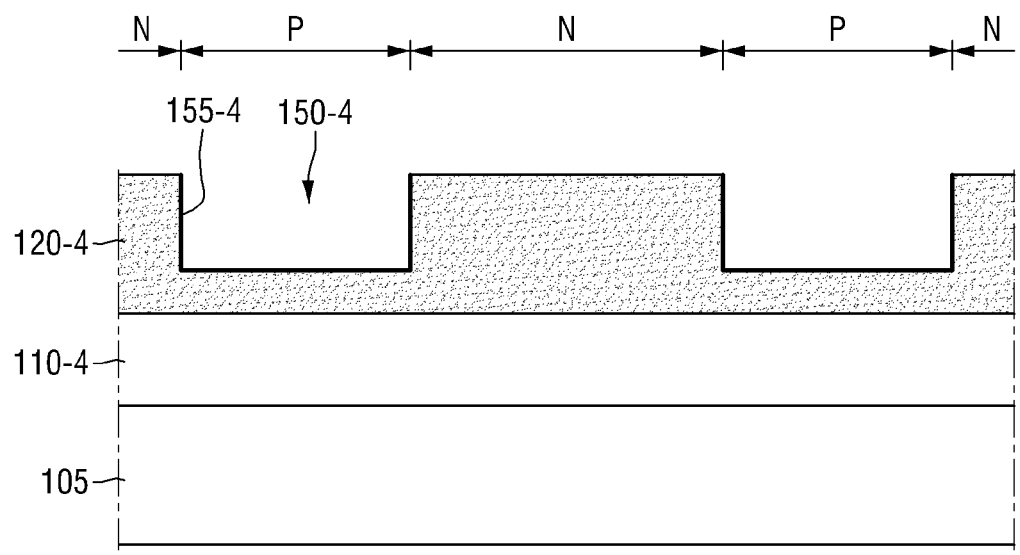

Referring to FIGS. 16 and 17, in an exemplary embodiment, the neutral layer 120-4 may be ashed by performing an oxygen plasma process using the soft pattern layer 130-4 as a mask, for example. By partially ashing the neutral layer 120-4, the seed patterns 150-4, which are engraved patterns that are recessed into the neutral layer 120-4, may be provided.

Hydroxyl groups (OH—) are disposed on the surfaces of parts of the neutral layer 120-4 that are exposed in the seed patterns 150-4 due to exposure to oxygen plasma, and as a result, a surface treatment layer 155-4 may be provided. The surface treatment layer 155-4 may be disposed on the bottom surfaces and the sidewalls of the seed patterns 150-4.

Parts of the neutral layer 120-4 that are exposed without being covered by the soft pattern layer 130-4 may be exposed to oxygen plasma during ashing, and may thus be recessed, thereby forming engraved regions that are recessed from the surface of the neutral layer 120-4. The patterns disposed in the engraved regions may be the seed patterns 150-4.

The soft pattern layer 130-4 may remain on the surfaces of parts of the neutral layer 120-4 in other relatively embossed regions.

After the ashing process, the remaining soft pattern layer 130-4 may be removed from the top of the neutral layer 120-4. The soft pattern layer 130-4 may remain unremoved from the embossed regions, and as a result, the neutral layer 120-4 may be divided into a polar area P and a neutral area N.

The polar area P may be provided by forming the surface treatment layer 155-4 in the seed patterns 150-4, and the neutral area N may be provided by removing the soft pattern layer 130-4 from the top of the neutral layer 120-4. As a result, a neutral layer 120-4 with different polarities from one surface to another surface thereof may be obtained.

Referring to FIG. 18, a block copolymer 160B-4 may be provided by applying a copolymer onto the surface of the neutral layer 120-4, which is divided into the polar area P and the neutral area N, and performing annealing.

The block copolymer 160B-4 may include a first block copolymer 1610-4, which is disposed in the polar area P, and a second block copolymer 1620-4, which is disposed in the neutral area N. The first block copolymer 1610-4 or the second block copolymer 1620-4 may include first monomer blocks 162-4 and second monomer blocks 167-4, and may be aligned in different directions depending on the surface that the first block copolymer 1610-4 or the second block copolymer 1620-4 contacts.

The first block copolymer 1610-4 contacts the surface of the surface treatment layer 155-4, which is disposed on the surfaces of the seed patterns 150-4, i.e., the surface of the polar area P. Accordingly, in the first block copolymer 1610-4, the first monomer blocks 162-4 and the second monomer blocks 167-4 may be aligned in a direction parallel to the surfaces of the seed patterns 150-4.

The second block copolymer 1620-4 contacts the surface of the neutral layer 120-4, i.e., the surface of the neutral area N. Accordingly, in the second block copolymer 1620-4, the first monomer blocks 162-4 and the second monomer blocks 167-4 may be aligned in a direction perpendicular to the surface of the neutral layer 120-4.

The first block copolymer 1610-4 may contact the surface treatment layer 155-4, which is hydrophilic to the first monomer blocks 162-4 or the second monomer blocks 167-4, and may thus be aligned in a direction parallel to its surface of contact with the polar area P. Accordingly, the second block copolymer 1620-4, which is disposed on the first block copolymer 1610-4, may be aligned according to the order of alignment of the first block copolymer 1610-4.

In an exemplary embodiment, the first monomer blocks 162-4 of the first block copolymer 1610-4, which are hydrophilic to the surface treatment layer 155-4, may be aligned first in a direction parallel to the surface of the surface treatment layer 155-4, for example. Then, the second block copolymer 1620-4, which is disposed on the first block copolymer 1610-4, may be aligned according to the alignment of the first block copolymer 1610-4 such that the second monomer blocks 167-4 of the second block copolymer 1620-4 may be aligned in a direction perpendicular to their surfaces of contact with the neutral layer 120-4 in the neutral area N.

In this manner, the first monomer blocks 162-4 and the second monomer blocks 167-4 of the second block copolymer 1620-4 may be aligned according to the order of alignment of the first block copolymer 1610-4. In the neutral area N, the second block copolymer 1620-4 may be self-aligned in the direction perpendicular to the surface of the neutral layer 120-4 according to the order of alignment of the first monomer blocks 162-4 and the second monomer blocks 167-4 of the second block copolymer 1620-4 on the first block copolymer 1610-4.

Thereafter, a first etching process may be performed by providing a first etching gas G1 as a source gas to the substrate 105 where the block copolymer 160B-4 is provided. During the first etching process, a reactive gas may be provided to the block copolymer 160B-4 as the first etching gas G1 so that the first monomer blocks 162-4 or the second monomer blocks 167-4 of the block copolymer 160B-4 may be partially etched.

Figure 19:
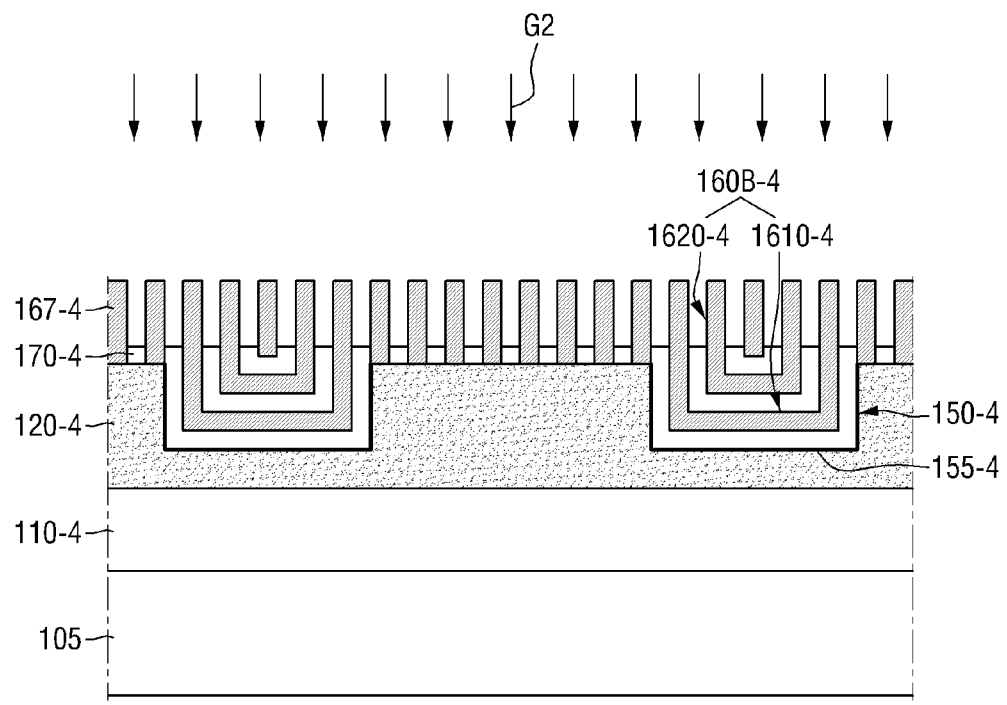

Referring to FIGS. 18 and 19, the first etching gas G1 may be provided to the block copolymer 160B-4 so that the first monomer blocks 162-4 or the second monomer blocks 167-4 may be partially etched. As a result, residual patterns 170-4 may be provided.

In an exemplary embodiment, the residual patterns 170-4 may be provided by etching the first monomer blocks 162-4 to the extent that the surface of the neutral layer 120-4 may not be exposed, for example. When the first monomer blocks 162-4 are etched to expose the surface of the neutral layer 120-4, the first monomer blocks 162-4 in the first bloc copolymers 1610-4 may be aligned in the direction parallel to the surfaces of the seed patterns 150-4, and thus, the first monomer blocks 162-4 may be excessively etched from the top of the first block copolymer 1610-4.

Accordingly, the shape of the second monomer blocks 167-4, which are provided at periodic intervals, may not be able to be uniformly maintained. That is, when the first monomer blocks 162-4 are excessively etched, the second monomer blocks 167-4 may not be able to be provided at periodic intervals, thereby making it difficult to form the wire patterns 101-4 at periodic intervals.

Therefore, the residual patterns 170-4 may be provided by etching the first monomer blocks 162-4 to the extent that the surface of the neutral layer 120-4 may not be exposed or to the extent that the surface of the surface treatment layer 155-4 may not be etched from the sides of the seed patterns 150-4.

A height difference may be provided between the residual patterns 170-4 and the second monomer blocks 167-4. That is, trenches may be defined among the second monomer blocks 167-4.

The residual patterns 170-4 and the layers below the residual patterns 170-4 may be physically etched by providing a second etching gas G2 to the substrate 105 where the residual patterns 170-4 and the trenches among the second monomer blocks 167-4 are provided. The second monomer blocks 167-4 may also be partially etched upon exposure to the second etching gas G2. In an exemplary embodiment, a non-reactive etching gas such as an inert gas may be used as the second etching gas G2.

Figure 20:
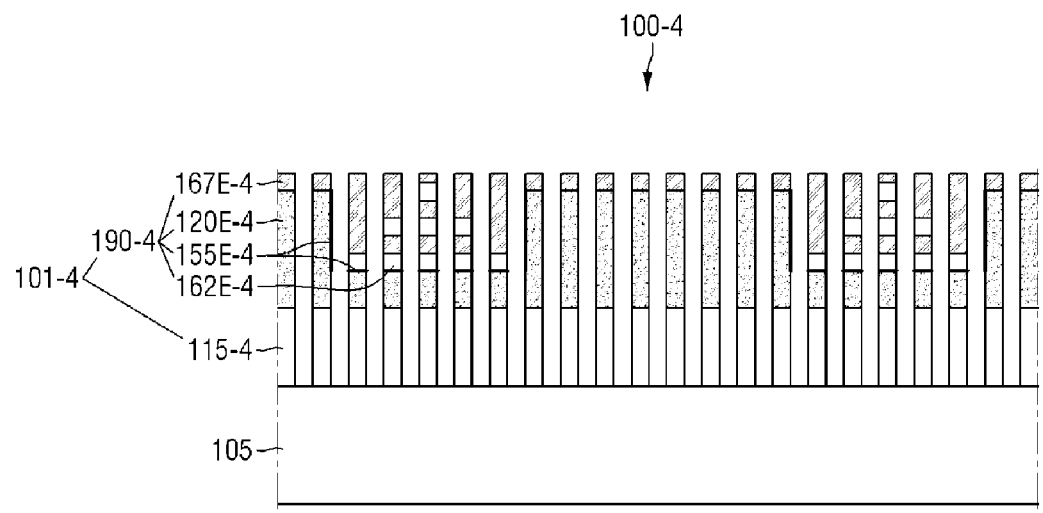

Referring to FIGS. 19 and 20 and further to FIG. 15, the wire patterns 101-4 may be provided at periodic intervals by etching the residual patterns 170-4, the layers below the residual patterns 170-4 and the second monomer blocks 167-4 with the use of the second etching gas G2.

The wire patterns 101-4 may include the first wire patterns 115-4, which are periodic patterns obtained by etching the metal layer 110-4. The first wire patterns 115-4 may be conductive wire patterns including a metal.

The substrate 105 where at least one of the metal layer 110-4, the neutral layer 120-4, the surface treatment layer 155-4, the first monomer blocks 162-4 and the second monomer blocks 167-4 are provided may be subjected to an etching process using the second etching gas G2. As a result, one or more second wire patterns 190-4 may be disposed on the first wire patterns 115-4.

Each of the second wire patterns 190-4 may include a neutral pattern 120E-4, which is disposed on at least one of the first wire patterns 115-4. At least one of the second wire patterns 190-4 may include at least one of a surface treatment pattern 155E-4, a first monomer block pattern 162E-4 and a second monomer block pattern 167E-4, which are disposed on the neutral pattern 120E-4.

In the exemplary embodiment of FIG. 15, the seed patterns 150-4 provide different polarity areas on the surface of the neutral layer 120-4, and as a result, the block copolymer 160B-4 may be self-aligned on the neutral layer 120-4. Accordingly, the exemplary embodiment of FIG. 15 may be applied to large-scale processing, and may provide a wire grid polarizer with nano patterns on the entire surface thereof without the need to form a non-pattern area on the wire grid polarizer.

Also, in the exemplary embodiment of FIGS. 15 and 19, the surface of the neutral layer 120-4 is treated to have different polarities from one area to another area, and thus, there is no need to form a non-pattern area. Accordingly, the transmissivity and polarization properties of a wire gird polarizer may be improved.

Also, there is no need to perform additional processes, such as trimming for forming patterns of a similar size to the wire patterns 101-4 or double patterning, to form the block copolymer 160B-4. Accordingly, the fabrication of a wire grid polarizer may be facilitated.

Figure 21:
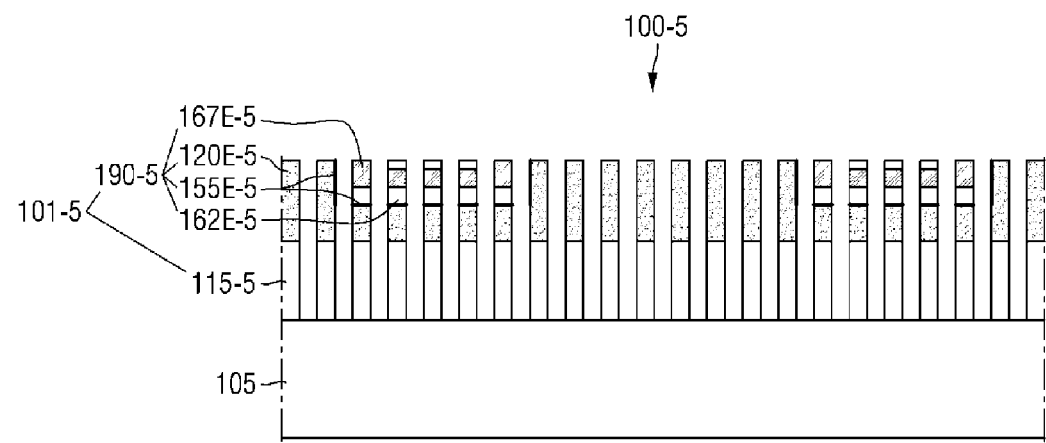
FIG. 21 is a cross-sectional view of a variation of the wire grid polarizer of the exemplary embodiment of FIG. 15.
Figure 22:
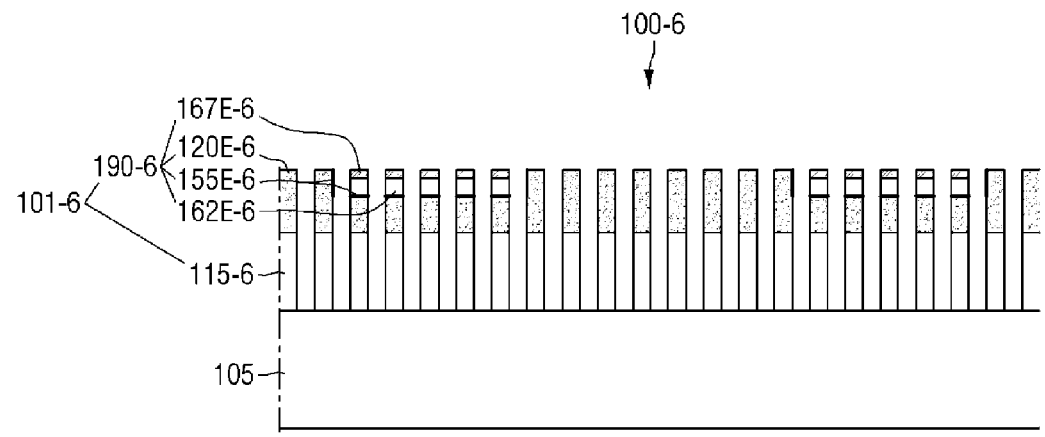
FIG. 22 is a cross-sectional view of another variation of the wire grid polarizer of the exemplary embodiment of FIG. 15.

FIG. 21 is a cross-sectional view of a variation of the wire grid polarizer according to the exemplary embodiment of FIG. 15, and FIG. 22 is a cross-sectional view of another variation of the wire grid polarizer according to the exemplary embodiment of FIG. 15.

In FIGS. 15 to 22, like reference numerals indicate like elements, and thus, descriptions thereof will be omitted or simplified.

Referring to FIG. 18 and FIG. 21 or 22, the extent to which first monomer blocks 162-4, second monomer blocks 167-4 and a neutral layer 120-4 of a wire grid polarizer 100-5 or 100-6 are etched during a second etching process using a second etching gas G2 may increase depending on the amount of exposure to the second etching gas G2.

That is, in the wire grid polarizer 100-5 or 100-6, the height of wire patterns 101-5 or 101-6, and particularly, the height of second wire patterns 190-5 or 190-6 may be adjusted by adjusting the amount by which the second wire patterns 190-5 or 190-6 is etched, respectively. Also, the shape of patterns that are exposed over the wire patterns 101-5 or 101-6 of the wire grid polarizer 100-5 or 100-6 may vary depending on the amount by which the second wire patterns 190-5 or 190-6 is etched, respectively.

Referring to FIG. 21, the wire grid polarizer 100-5 includes the wire patterns 101-5, and the wire patterns 101-5 include first wire patterns 115-5 and the second wire patterns 190-5. The second wire patterns 190-5 may be disposed on the first wire patterns 115-5.

At least one of the second wire patterns 190-5 may include a neutral pattern 120E-5.

A surface treatment pattern 155E-5 may be disposed on a side of at least one neutral pattern 120E-5.

In an alternative exemplary embodiment, at least one of the second wire patterns 190-5 may include a neutral pattern 120E-5, a surface treatment pattern 155E-5, a first monomer block pattern 162E-5 and a second monomer block pattern 167E-5, which are sequentially deposited on a first wire pattern 115-5.

In an alternative exemplary embodiment, at least one of the second wire patterns 190-5 may include a neutral pattern 120E-5, a surface treatment pattern 155E-5, a first monomer block pattern 162E-5 and a second monomer block pattern 167E-5, which are sequentially deposited on a first wire pattern 115-5, and may also include another first monomer block pattern 162E-5, which is deposited on the second monomer block pattern 167E-5.

Accordingly, either one of a first monomer block pattern 162E-5 and a second monomer block pattern 167E-5 or a neutral pattern 120E-5 may be exposed at the top of each of the second wire patterns 190-5. At least one of the second wire patterns 190-5 with a neutral pattern 120E-5 exposed at the top thereof may have a surface treatment pattern 155E-5 disposed on a side thereof.

Referring to FIG. 22, the wire grid polarizer 100-6 includes the wire patterns 101-6, and the wire patterns 101-6 include first wire patterns 115-6 and the second wire patterns 190-6. The second wire patterns 190-6 may be disposed on the first wire patterns 115-6.

At least one of the second wire patterns 190-6 may include a neutral pattern 120E-6.

A surface treatment pattern 155E-6 may be disposed on a side of at least one neutral pattern 120E-6.

In an alternative exemplary embodiment, at least one of the second wire patterns 190-6 may include a neutral pattern 120E-6, a surface treatment pattern 155E-6, a first monomer block pattern 162E-6 and a second monomer block pattern 167E-6, which are sequentially deposited on a first wire pattern 115-6.

Accordingly, a second monomer block pattern 167E-6 or a neutral pattern 120E-6 may be exposed at the top of each of the second wire patterns 190-6. At least one of the second wire patterns 190-6 with a neutral pattern 120E-6 exposed at the top thereof may have a surface treatment pattern 155E-6 disposed on a side of the neutral pattern 120E-6.

According to the variations to the exemplary embodiment of FIG. 15, as illustrated in FIGS. 21 and 22, the wire patterns 101-5 or 101-6 may be provided in various shapes by adjusting the amount by which the second wire patterns 190-5 or 190-6 of the wire patterns 101-6 or 101-6, respectively, is etched.

Figure 23:
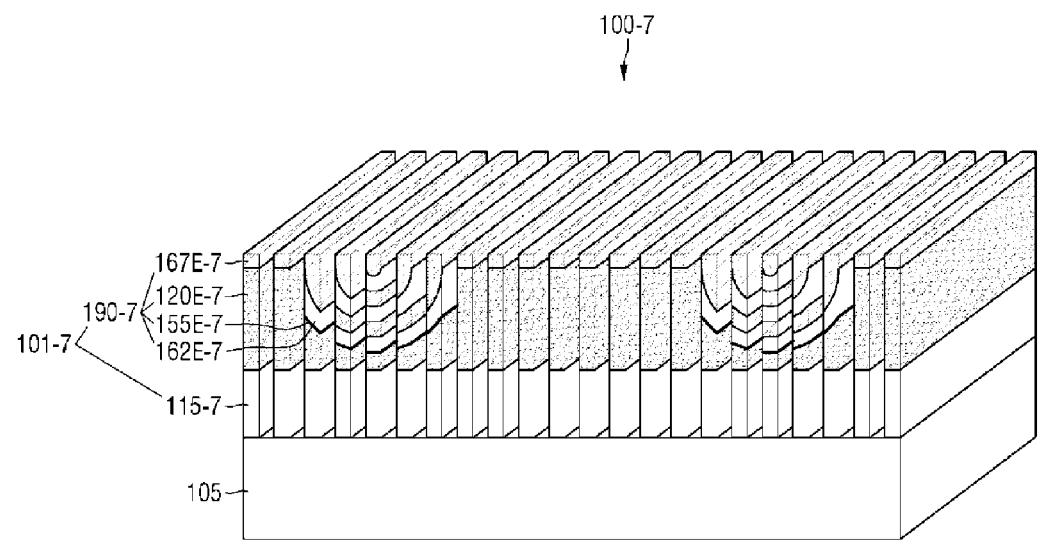
FIG. 23 is a perspective view of another exemplary embodiment of a wire grid polarizer according to the invention.

FIG. 23 is a perspective view of a wire grid polarizer according to another exemplary embodiment of the invention, and FIGS. 24 to 28 are cross-sectional views illustrating a method of fabricating the wire grid polarizer according to the exemplary embodiment of FIG. 23. The illustrated exemplary embodiment will hereinafter be described with reference to FIGS. 23 to 28, and further reference to FIGS. 1 to 14. In FIGS. 1 to 14 and 23 to 28, like reference numerals indicate like elements, and thus, descriptions thereof will be omitted or simplified.

Referring to FIG. 23, a wire grid polarizer 100-7 may include a plurality of wire patterns 101-7, which are disposed on a substrate 105 to protrude.

The wire patterns 101-7 may include first wire patterns 115-7, which protrude from the substrate 105, and one or more second wire patterns 190-7, which are disposed on one or more of the first wire patterns 115-7. Each of the second wire patterns 190-7 may include at least one of a neutral pattern 120E-7, a surface treatment pattern 155E-7, a first monomer block pattern 162E-7 and a second monomer block pattern 167E-7.

In the illustrated exemplary embodiment, a plurality of seed patterns 150-7 (refer to of FIG. 25) may be semicircular with respect to a cross section of a neutral layer 120-7. Accordingly, in at least one of the second wire patterns 190-7, the neutral pattern 120E-7, the surface treatment pattern 155E-7, the first monomer block pattern 162E-7 and the second monomer block pattern 167E-7 may form curved stripes in a cross-sectional view.

In an exemplary embodiment, the seed patterns 150-7 may be provided in a semicircular shape with respect to a cross section of the neutral layer 120-7, and the surface treatment pattern 155E-7 may also be provided in each of the seed patterns 150-7, conforming to the semicircular shape of the seed patterns 150-7.

Accordingly, the first monomer block pattern 162E-7 and the second monomer block pattern 167E-7 may be disposed on the surface treatment pattern 155E-7 in a curved shape with respect to the lamination surfaces thereof. The first monomer block pattern 162E-7 and the second monomer block pattern 167E-7 may have the same curvature as the surface treatment pattern 155E-7.

The surface treatment pattern 155E-7, the first monomer block pattern 162E-7 and the second monomer block pattern 167E-7 may all have the same curvature, but may have different radiuses of curvature. In an exemplary embodiment, the radius of curvature of the wire patterns 101-7 may decrease in an order of the surface treatment pattern 155E-7, the first monomer block pattern 162E-7 and the second monomer block pattern 167E-7.

The wire grid polarizer 100-7 may include the first wire patterns 115-7 and the second wire patterns 190-7, which are curved with respect to a cross section perpendicular to the lamination surfaces of the first wire patterns 115-7. Accordingly, it is possible to fabricate a polarizer with no non-pattern area and thus to improve the transmissivity and polarization characteristics of a polarizer.

A method of fabricating the wire grid polarizer according to the exemplary embodiment of FIG. 23 will hereinafter be described.

Figure 24:
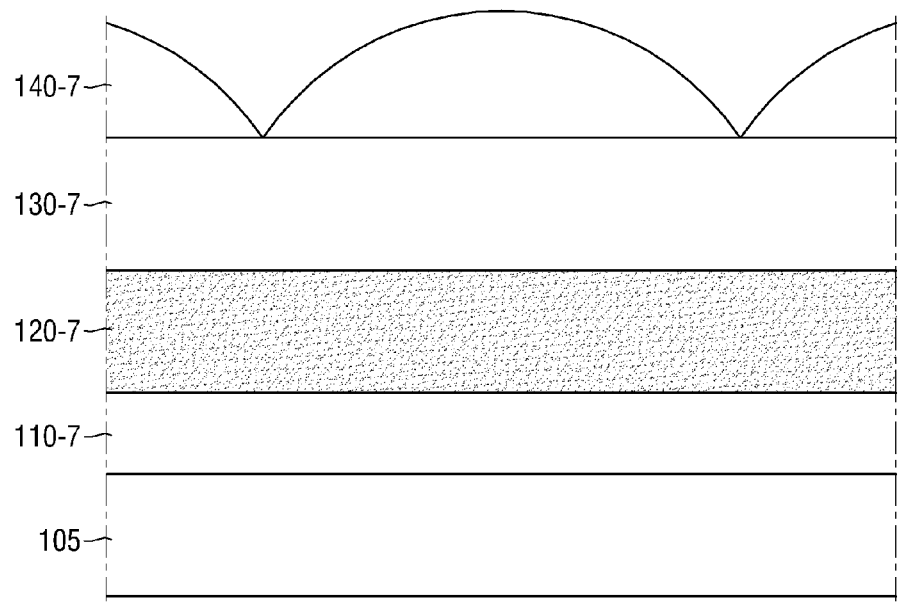
FIGS. 24 to 28 are cross-sectional views illustrating a method of fabricating the wire grid polarizer of the exemplary embodiment of FIG. 23.

Referring to FIG. 24, a metal layer 110-7 is disposed on the substrate 105, and a neutral layer 120-7 is disposed on the metal layer 110-7. A soft layer is disposed on the neutral layer 120-7, and a soft pattern layer 130-7 is provided by patterning the soft layer. In an exemplary embodiment, the soft pattern layer 130-7 may be provided to partially expose and partially cover the neutral layer 120-7 disposed therebelow. In an exemplary embodiment, the neutral layer 120-7 may include a ketene-series compound, an azide-series compound and a combination thereof.

In an exemplary embodiment, semicircular patterns 140-7 may be provided on the soft pattern layer 130-7 in a cross-sectional view with respect to the lamination surfaces of the metal layer 110-7 and the neutral layer 120-7.

Figure 25:
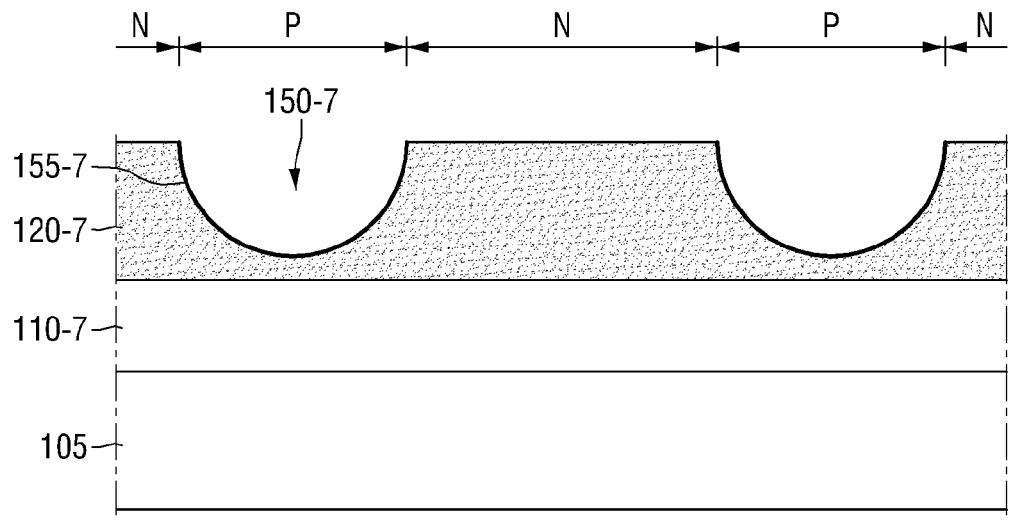

Referring to FIGS. 24 and 25, the neutral layer 120-7 may be ashed by performing an oxygen plasma process using the soft pattern layer 130-7 as a mask, for example. By partially ashing the neutral layer 120-7, the seed patterns 150-7, which are engraved patterns that are recessed into the neutral layer 120-7, may be provided.

In an exemplary embodiment, hydroxyl groups (OH—) are disposed on the surfaces of parts of the neutral layer 120-7 that are exposed in the seed patterns 150-7 due to exposure to oxygen plasma, and as a result, a surface treatment layer 155-7 may be provided. The surface treatment layer 155-7 may be provided along the curved surfaces of the seed patterns 150-7.

Parts of the neutral layer 120-7 that are exposed without being covered by the soft pattern layer 130-7 may be exposed to oxygen plasma during ashing, and may thus be recessed, thereby forming engraved regions that are recessed from the surface of the neutral layer 120-7.

The soft pattern layer 130-7 may remain on the surfaces of parts of the neutral layer 120-7 in other relatively embossed regions.

After the ashing process, the remaining soft pattern layer 130-7 may be removed from the top of the neutral layer 120-7. The soft pattern layer 130-7 may remain unremoved from the embossed regions, and as a result, the neutral layer 120-7 may be divided into a polar area P and a neutral area N.

The polar area P may be provided by forming the surface treatment layer 155-7 in the seed patterns 150-7, and the neutral area N may be provided by removing the soft pattern layer 130-7 from the top of the neutral layer 120-7. As a result, a neutral layer 120-7 with different polarities from one surface to another surface thereof may be provided.

Figure 26:
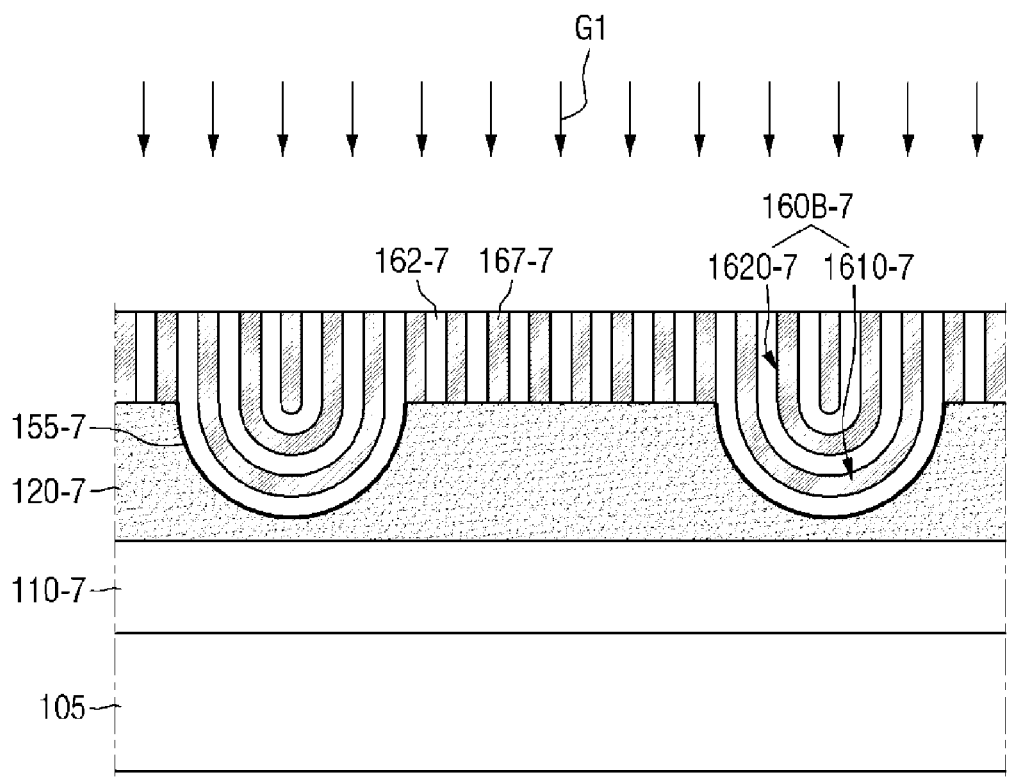

Referring to FIG. 26, a block copolymer 160B-7 may be provided by applying a copolymer onto the surface of the neutral layer 120-7, which is divided into the polar area P and the neutral area N, and performing annealing.

The block copolymer 160B-7 may include a first block copolymer 1610-7, which is disposed in the polar area P, and a second block copolymer 1620-7, which is disposed in the neutral area N. The first block copolymer 1610-7 or the second block copolymer 1620-7 may include first monomer blocks 162-7 and second monomer blocks 167-7, and may be aligned in different directions through phase separation, depending on the surface that they contact.

The first block copolymer 1610-7 contacts the surface of the surface treatment layer 155-7, which is disposed on the surfaces of the seed patterns 150-7, i.e., the surface of the polar area P. Accordingly, in the first block copolymer 1610-7, the first monomer blocks 162-7 and the second monomer blocks 167-7 may be aligned in a direction parallel to the surfaces of the seed patterns 150-7 through phase separation.

The second block copolymer 1620-7 contacts the surface of the neutral layer 120-7, i.e., the surface of the neutral area N. Accordingly, in the second block copolymer 1620-7, the first monomer blocks 162-7 and the second monomer blocks 167-7 may be aligned in a direction perpendicular to the surface of the neutral layer 120-7 through phase separation.

The first block copolymer 1610-7 may contact the surface treatment layer 155-7, which are hydrophilic to the first monomer blocks 162-7 or the second monomer blocks 167-7, and may thus be aligned through phase separation. Accordingly, the second block copolymer 1620-7, which is disposed on the first block copolymer 1610-7, may be aligned according to the order of alignment of the first block copolymer 1610-7.

In this manner, the first monomer blocks 162-7 and the second monomer blocks 167-7 of the second block copolymer 1620-7 may be aligned according to the order of alignment of the first block copolymer 1610-7. In the neutral area N, the second block copolymer 1620-7 may be self-aligned in the direction perpendicular to the surface of the neutral layer 120-7 according to the order of alignment of the first monomer blocks 162-7 and the second monomer blocks 167-7 of the second block copolymer 1620-7 on the first block copolymer 1610-7.

Thereafter, a first etching process may be performed by providing a first etching gas G1 as a source gas to the substrate 105 where the block copolymer 160B-7 is provided. During the first etching process, a reactive gas may be provided to the block copolymer 160B-7 as the first etching gas G1 so that the first monomer blocks 162-7 or the second monomer blocks 167-7 of the block copolymer 160B-7 may be partially etched.

Figure 27:
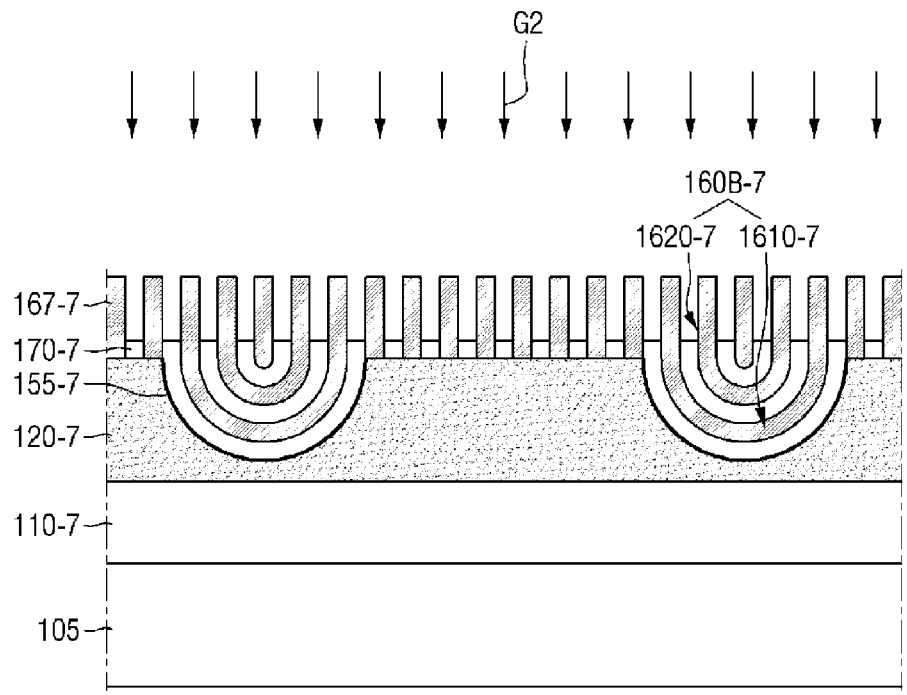

Referring to FIGS. 26 and 27, the first etching gas G1 may be provided to the block copolymer 160B-7 so that the first monomer blocks 162-7 or the second monomer blocks 167-7 may be partially etched. As a result, residual patterns 170-7 may be provided.

In an exemplary embodiment, the residual patterns 170-7 may be provided by etching the first monomer blocks 162-7 to the extent that the surface of the neutral layer 120-7 may not be exposed or to the extent that the surface of the surface treatment layer 155-7 may not be etched from the sides of the seed patterns 150-7, for example.

A height difference may be disposed between the residual patterns 170-7 and the second monomer blocks 167-7. That is, trenches may be provided among the second monomer blocks 167-7.

The residual patterns 170-7 and the layers below the residual patterns 170-7 may be physically etched by providing a second etching gas G2 to the substrate 105 where the residual patterns 170-7 and the trenches among the second monomer blocks 167-7 are provided. The second monomer blocks 167-7 may also be partially etched upon exposure to the second etching gas G2. A non-reactive etching gas such as an inert gas may be used as the second etching gas G2.

Figure 28:
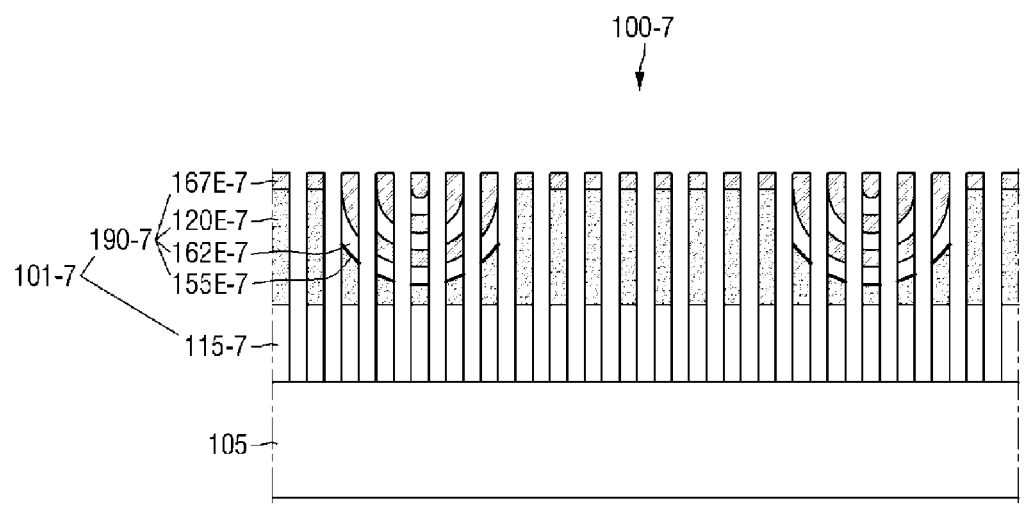

Referring to FIGS. 23, 27 and 28, the wire patterns 101-7 may be provided at periodic intervals by etching the residual patterns 170-7, the layers below the residual patterns 170-7 and the second monomer blocks 167-7 with the use of the second etching gas G2.

The wire patterns 101-7 may include the first wire patterns 115-7, which are periodic patterns obtained by etching the metal layer 110-7. In an exemplary embodiment, the first wire patterns 115-7 may be conductive wire patterns including a metal.

The substrate 105 where at least one of the metal layer 110-7, the neutral layer 120-7, the surface treatment layer 155-7, the first monomer blocks 162-7 and the second monomer blocks 167-7 are provided may be subjected to an etching process using the second etching gas G2. As a result, one or more second wire patterns 190-7 may be disposed on one or more of the first wire patterns 115-7.

Each of the second wire patterns 190-7 may include a neutral pattern 120E-7, which is disposed on at least one of the first wire patterns 115-7. In at least one of the second wire patterns 190-7, at least one of a surface treatment pattern 155E-7, a first monomer block pattern 162E-7 a second monomer block pattern 167E-7 may be disposed on the neutral pattern 120E-7.

In the exemplary embodiment of FIGS. 23 and 27, the seed patterns 150-7 provide different polarity areas on the surface of the neutral layer 120-7, and as a result, the block copolymer 160B-7 may be self-aligned on the neutral layer 120-7. Accordingly, the exemplary embodiment of FIG. 23 may be applied to large-scale processing, and may provide a wire grid polarizer with nano patterns on the entire surface thereof without the need to form a non-pattern area on the wire grid polarizer.

Also, in the exemplary embodiment of FIGS. 23 and 27, the surface of the neutral layer 120-7 is treated to have different polarities from one area to another area, and thus, there is no need to form a non-pattern area. Accordingly, the transmissivity and polarization properties of a wire gird polarizer may be improved.

Also, there is no need to perform additional processes, such as trimming for forming patterns of a similar size to the wire patterns 101-7 or double patterning, to form the block copolymer 160B-7. Accordingly, the fabrication of a wire grid polarizer may be facilitated.

Figure 29:
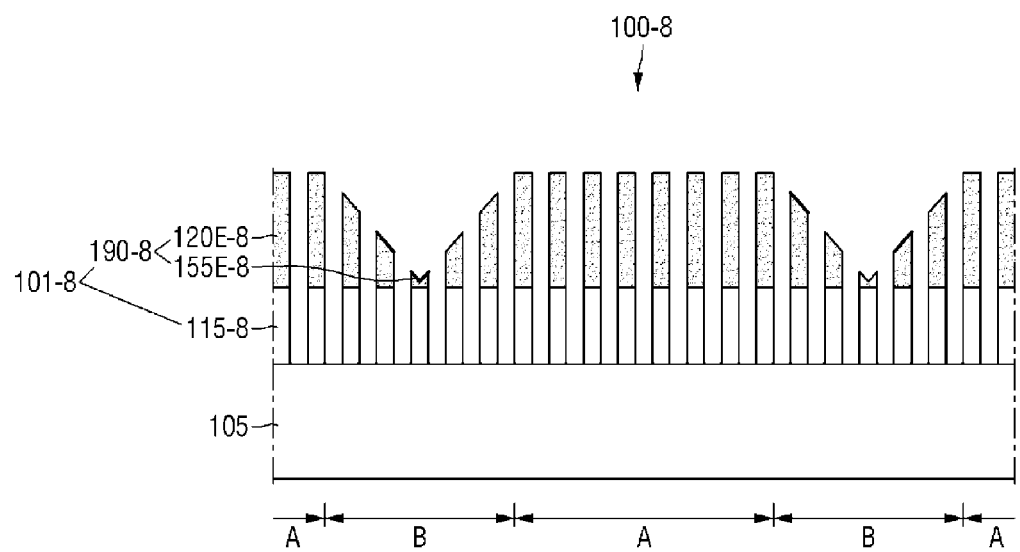
FIGS. 29 to 31 are cross-sectional views of other exemplary embodiments of wire grid polarizers according to the invention.
Figure 30:
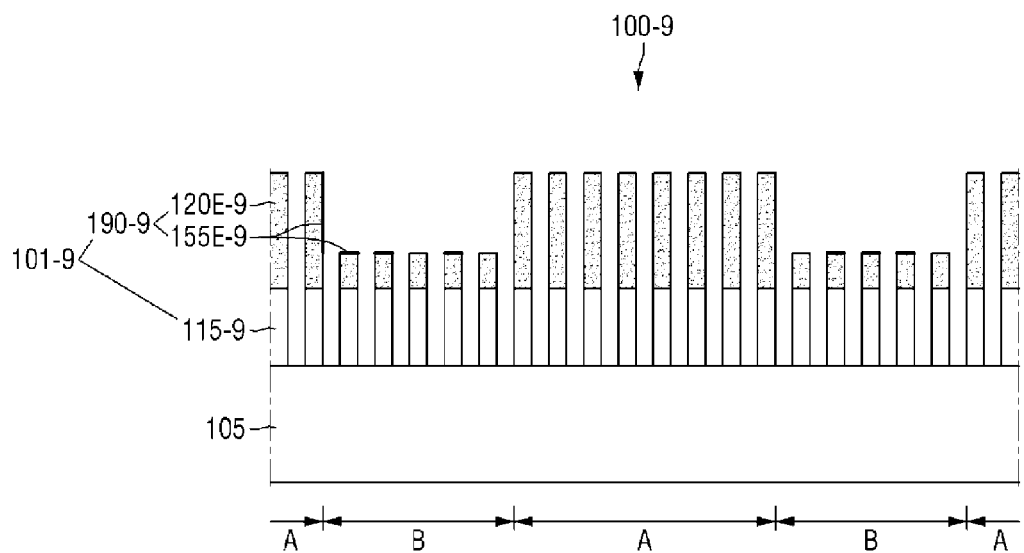
Figure 31:
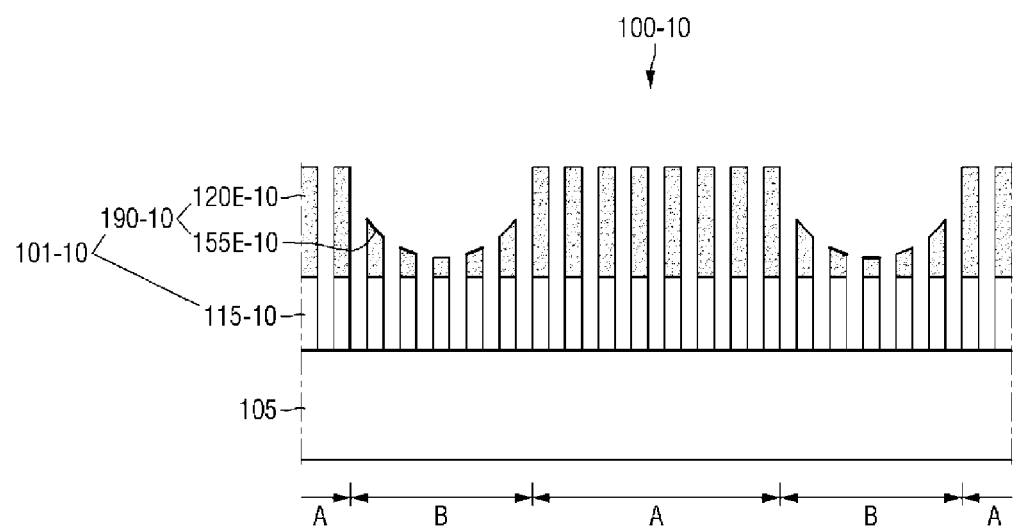

FIGS. 29 to 31 are cross-sectional views of wire grid polarizers according to other exemplary embodiments of the invention.

Referring to FIGS. 29 to 31, a wire grid polarizer 100-8, 100-9 or 100-10 may include and a plurality of wire patterns 101-8, 101-9 or 101-10, which disposed on a substrate 105 to protrude. The wire patterns 101-8, 101-9 or 101-10 may include first wire patterns 115-8, 115-9 or 115-10, which include a metal and contact the surface of the substrate 105, and one or more second wire patterns 190-8, 190-9 or 190-10, which are disposed on one or more of the first wire patterns 115-8, 115-9 or 115-10.

Each of the second wire patterns 190-8, 190-9 or 190-10 may include a neutral pattern 120E-8, 120E-9 or 120E-10, respectively. In at least one of the second wire patterns 190-8, 190-9 or 190-10, a surface treatment pattern 155E-8, 155E-9 or 155E-10 may be disposed on the neutral pattern 120E-8, 120E-9 or 120E-10, respectively.

Referring back to FIGS. 1 to 21, during the fabrication of the wire grid polarizer 100-1, 100-4 or 100-7, second wire patterns 190-1, 190-4 or 190-7 each having at least one of a neutral pattern 120E-1, 120E-4 or 120E-7, a surface treatment pattern 155E-1, 155E-4 or 155E-7, a first monomer block pattern 162E-1, 162E-4 or 162E-7 and a second monomer block pattern 167E-1, 167E-4 or 167E-7 may be disposed on first wire patterns 115-1, 115-4 or 115-7.

The first monomer block pattern 162E-1, 162E-4 or 162E-7, which is adjacent to the surface treatment pattern 155E-1, 155E-4 or 155E-7, may be removed by providing an etchant or an etching gas to the second wire patterns 190-1, 190-4 or 190-7. By removing the first monomer block pattern 162E-1, 162E-4 or 162E-7, the patterns that are disposed above the first monomer block pattern 162E-1, 162E-4 or 162E-7 may all be lifted off. The patterns disposed above the first monomer block pattern 162E-1, 162E-4 or 162E-7 may include at least one of another second monomer block pattern 167E-1, 167E-4 or 167E-7 and another first monomer block pattern 162E-1, 162E-4 or 162E-7.

The surface treatment pattern 155E-1, 155E-4 or 155E-7, which is disposed between the first monomer block pattern 162E-1, 162E-4 or 162E-7 and the neutral pattern 120E-1, 120E-4 or 120E-7 may also be removed, or may remain unremoved, during the removal of the first monomer block pattern 162E-1, 162E-4 or 162E-7.

In short, the wire grid polarizer 100-8, 100-9 or 100-1, may include the wire patterns 101-8, 101-9 or 101-10, which are disposed on the substrate 105 to have different heights. The wire patterns 101-8, 101-9 or 101-10 may include the first wire patterns 115-8, 115-9 or 115-10, which are disposed on the substrate 105, and the second wire patterns 190-8, 190-9 or 190-10, which are disposed on the first wire patterns 115-8, 115-9 or 115-10, and each of the second wire patterns 190-8, 190-9 or 190-10 may include the neutral pattern 120E-8, 120E-9 or 120E-10.

At least one of the second wire patterns 190-8, 190-9 or 190-10 may include the surface treatment pattern 155E-8, 155E-9 or 155E-10, which is disposed on the neutral pattern 120E-8, 120E-9 or 120E-10.

Accordingly, the wire grid polarizer 100-8, 100-9 or 100-10 may provide wire patterns 101-8, 101-9 or 101-10 with different heights from one another, and the transmissivity and polarization properties of the wire grid polarizer 100-8, 100-9 or 100-10 may be controlled by controlling the height of the wire patterns 101-8, 101-9 or 101-10.

In an exemplary embodiment, referring to FIGS. 29 and 31, the wire grid polarizer 100-8 or 100-10 may have patterns disposed in a diagonal shape or a semicircular shape in a cross-sectional view, depending on the shape of seed patterns 150 (refer to FIG. 5). By removing the patterns from above the seed patterns 150, the second wire patterns 190-8 or 190-10 may be provided to have different heights from area to area and/or from one another.

The wire grid polarizer 100-8 or 100-10 may include a first area A where the wire patterns 101-8 or 101-10 all have the same height and a second area B where the wire patterns 101-8 or 101-10 have a different height from the first area A. In the second area B, the wire patterns 101-8 or 101-10 may have different heights from one another.

In at least one of the second wire patterns 190-8 or 190-10 in the second area B, the surface treatment pattern 155E-8 or 155E-10 may be disposed on the neutral pattern 120E-8 or 120E-10.

Referring to FIG. 30, the wire grid polarizer 100-9 may have patterns disposed in a rectangular shape in a cross-sectional view, depending on the shape of seed patterns 150, and the second wire patterns 190-9 may be provided to have different heights from area to area.

In an exemplary embodiment, the wire grid polarizer 100-9 may include a first area A where the wire patterns 101-9 all have the same height and a second area B where the wire patterns 101-9 have a different height from the first area A. In the second area B, the wire patterns 101-9 may all have the same height.

In at least one of the second wire patterns 190-9 in the second area B, the surface treatment pattern 155E-9 may be disposed on the neutral pattern 120E-9. The surface treatment pattern 155E-9 may also be disposed on a side of at least one of the neutral pattern 120E-9 in the first area A in close vicinity of the second area B.

Accordingly, the wire grid polarizer 100-8, 100-9 or 100-10 may provide wire patterns 101-8, 100-9 or 101-10 with different heights from one another, and the transmissivity and polarization properties of the wire grid polarizer 100-8, 100-9 or 100-10 may be controlled by controlling the height of the wire patterns 101-8, 101-9 or 101-10.

Figure 32:
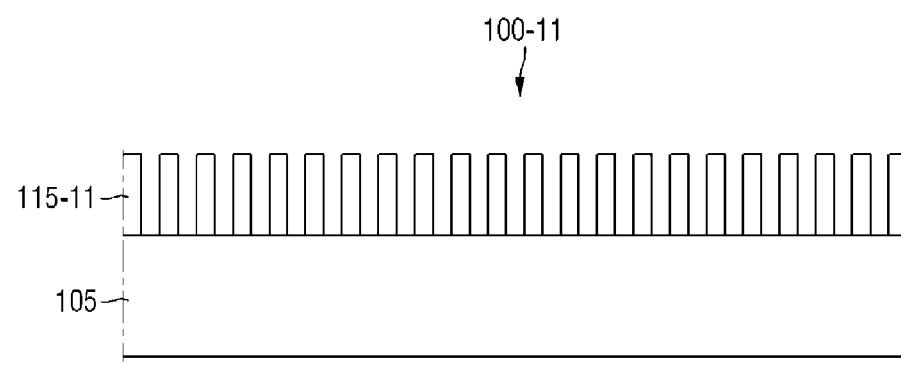
FIG. 32 is a cross-sectional view of another exemplary embodiment of a wire grid polarizer according to the invention.

FIG. 32 is a cross-sectional view of a wire grid polarizer according to another exemplary embodiment of the invention. The illustrated exemplary embodiment will hereinafter be described with reference to FIG. 32 and further reference to FIGS. 1 to 31.

Referring to FIG. 32, a wire grid polarizer 100-11 may include first wire patterns 115-11, which are disposed on a substrate 105 to protrude. The first wire patterns 115-11 may contact the surface of the substrate 105 and may include a metal. The first wire patterns 115-11 may form wire patterns of the wire grid polarizer 100-11 alone.

Referring back to FIGS. 1 to 31, during the fabrication of the wire grid polarizer 100, 100-4 or 100-7, second wire patterns 190, 190-4 or 190-7 each having at least one of a neutral pattern 120E, 120E-4 or 120E-7, a surface treatment pattern 155E, 155E-4 or 155E-7, a first monomer block pattern 162E, 162E-4 or 162E-7 and a second monomer block pattern 167E, 167E-4 or 167E-7 may be disposed on first wire patterns 115, 115-4 or 115-7.

The neutral pattern 120E, 120E-4 or 120E-7 may be removed by providing an etchant or an etching gas to the second wire patterns 190, 190-4 or 190-7. By removing the neutral pattern 120E, 120E-4 or 120E-7, the patterns that are disposed above the neutral pattern 120E, 120E-4 or 120E-7 may all be lifted off.

By removing the patterns that are disposed above the first wire patterns 115-11, only the first wire patterns 115-11 may be allowed to remain on the substrate at uniform intervals and to serve as wire patterns.

A protective layer (not illustrated) may also be provided on the substrate 105 where the first wire patterns 115-11 are provided. The protective layer may protect the first wire patterns 115-11, which protrude from the substrate 105, and may allow the wire grid polarizer 100-11 to be placed in contact with a target product with ease.

Figure 33:
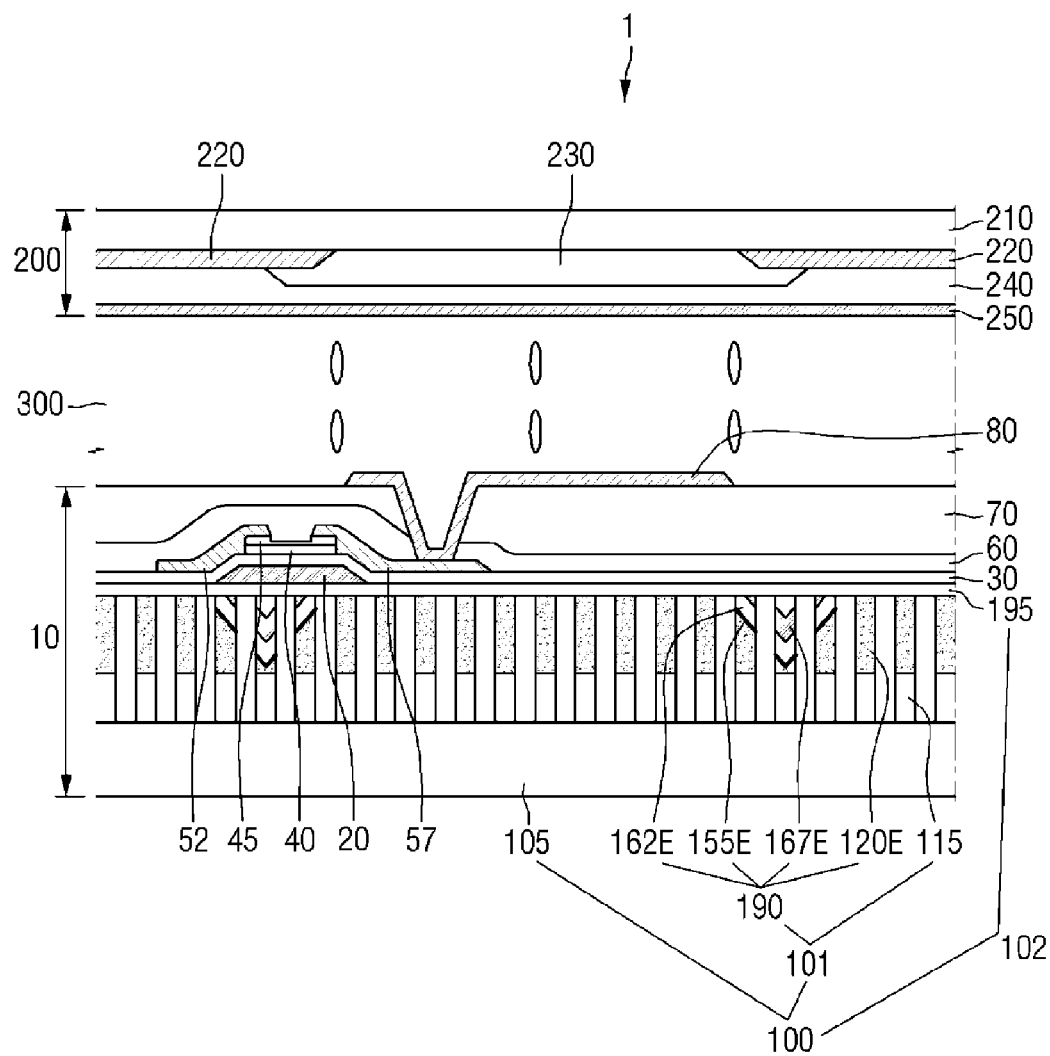
FIG. 33 is a cross-sectional view of an exemplary embodiment of a display device including a wire grid polarizer according to the invention.

FIG. 33 is a cross-sectional view of a display device including a wire grid polarizer according to an exemplary embodiment of the invention. The wire grid polarizer according to the illustrated exemplary embodiment will hereinafter be described with reference to FIG. 33 and further reference to FIGS. 1 to 32.

Referring to FIG. 33, a display device 1 may include a first display substrate 10, a second display substrate 200, which is spaced from, and faces, the first display substrate 10, and a liquid crystal layer 300, which is interposed between the first and second display substrates 10 and 200. A plurality of pixels, which are arranged in a matrix, may be defined on the first and second display substrates 10 and 200.

Gate lines (not illustrated), which extend in a first direction, and data lines (not illustrated), which extend in a second direction that is perpendicular to the first direction, may be disposed on the first display substrate 10. The pixels may be defined by the gate lines and the data lines, and a pixel electrode 80 may be disposed in each of the pixels. However, the invention is not limited thereto, and the pixels may not be defined by the gate lines and the data lines.

The pixel electrode 80 may be provided with a data voltage via a thin-film transistor ("TFT"), which is a switching element. A gate electrode 20, which is the control terminal of the TFT, may be connected to one of the gate lines, a source electrode 52, which is the input terminal of the TFT, may be connected to one of the data lines, and a drain electrode 57, which is the output terminal of the TFT, may be connected to the pixel electrode 80 via a contact hole. The channel of the TFT may be provided by a semiconductor layer 40. An ohmic contact layer 45 with a high work function may be disposed between the semiconductor layer 40 and the source and drain electrodes 52 and 57. By doping the semiconductor layer 40 with a dopant, the ohmic contact layer 45 may be provided to have a high work function.

The semiconductor layer 40 may be disposed to overlap the gate electrode 20. The source and drain electrodes 52 and 57 may be spaced from each other with respect to the semiconductor layer 40. The pixel electrode 80 may generate an electric field together with a common electrode 250, and may thus control the orientation of liquid crystal molecules in the liquid crystal layer 300 disposed therebetween. In an exemplary embodiment, the liquid crystal layer 300 may be of a twisted nematic ("TN") mode, a vertical alignment ("VA") mode, or a horizontal alignment mode (such as an in-plane switching ("IPS") mode or a fringe field switching ("FFS") mode) with positive dielectric anisotropy, but the invention is not limited thereto.

A color filter 230 may be disposed on the second display substrate 200 for each of the pixels. In an exemplary embodiment, the color filter 230 may include red, green and blue color filter, which may be alternately arranged. A light-shielding pattern 220 may be disposed at the boundary between the color filter 230 and another color filter 230. The light-shielding pattern 220 may be disposed to extend into a non-display area of the second display substrate 200. The common electrode 250 may be integrally disposed in the second display substrate 200 regardless of the pixels.

The display device 1 will hereinafter be described in further detail.

The first display substrate 10 may use a wire grid polarizer substrate including a wire grid polarizer (for example, the wire grid polarizer 100, 100-1, 100-2, 100-3, 100-4, 100-5, 100-6, 100-7, 100-8, 100-9, 100-10, or 100-11) as a base substrate. In the description that follows, it is assumed that the wire gird polarizer substrate 102 includes the wire grid polarizer 100 of FIG. 1, but the invention is not limited thereto.

In an exemplary embodiment, a substrate 105 may be a transparent insulating substrate including glass or a transparent plastic material, for example.

The wire grid polarizer substrate 102 may include a protective layer 195, which protects and insulates a plurality of wire patterns 101 of the wire grid polarizer 100.

The wire patterns 101 may be disposed on the substrate 105 to protrude.

The wire patterns 101 may include first wire patterns 115, which are disposed on the substrate 105, and one or more second wire patterns 190, which are disposed on one or more of the first wire patterns 115. At least one of the second wire patterns 190 may include a neutral pattern 120E, a surface treatment pattern 155E, and a first monomer block pattern 162E and a second monomer block pattern 167E.

In the wire grid polarizer substrate 102, nano patterns, i.e., the wire patterns 101, may be disposed on the entire surface of the substrate 105 at periodic intervals without the need to additionally provide a non-pattern area. Accordingly, the transmissivity and the polarization efficiency of the display device 1 may be improved by placing the wire grid polarizer 100 without regard to areas with no light transmitted therethrough such as an area where TFTs are provided. Therefore, the luminance of the display device 1 may be improved.

The gate lines, which include a conductive material, and the gate electrode 20, which protrudes from one of the gate lines, may be disposed on the protective layer 195 of the wire grid polarizer substrate 102. Although not specifically illustrated, the gate lines may extend into the non-display area, and may form gate pads in the non-display area.

The gate lines and the gate electrode 20 may be covered by a gate insulating layer 30.

The semiconductor layer 40 and the ohmic contact layer 45 may be disposed on the gate insulating layer 30. The source electrode 52, which is branched off from one of the data lines, and the drain electrode 57, which is spaced from the source electrode 52, may be disposed on the semiconductor layer 40 and the ohmic contact layer 45. Although not specifically illustrated, the data lines may extend into the non-display area, and may form data pads in the non-display area.

A passivation layer 60, which includes an insulating layer such as a silicon nitride layer, a silicon oxide layer or a silicon oxynitride layer, may be disposed on the source and drain electrodes 52 and 57, and an organic layer 70 may be disposed on the passivation layer 60 using an organic material. The passivation layer 60 and the organic layer 70 may be provided not only in a display area, but also in the non-display area. In another exemplary embodiment, the passivation layer 60 may be omitted.

The pixel electrode 80 may be disposed on the organic layer 70 for each of the pixels, using a conductive material. The pixel electrode 80 may be electrically connected to the drain electrode 57 via the contact hole that is defined through the organic layer 70 and the passivation layer 60 and exposes the drain electrode 57 therethrough. In an exemplary embodiment, the pixel electrode 80 may include indium tin oxide ("ITO"), indium zinc oxide ("IZO"), indium oxide, zinc oxide, tin oxide, gallium oxide, titanium oxide, Al, silver (Ag), platinum (Pt), Cr, Mo, tantalum (Ta), niobium (Nb), zinc (Zn), magnesium (Mg), or an alloy or deposition layer thereof, for example.

The second display substrate 200 will hereinafter be described. The second display substrate 200 may use a second substrate 210 as a base substrate. The second substrate 210 may be a transparent insulating substrate including glass or a transparent plastic material, for example.

The light-shielding pattern 220 may be disposed on the second substrate 210. The light-shielding pattern 220 may be provided not only in the display area, but also in the non-display area.

The color filter 230 may be disposed on the light-shielding pattern 220 in the display area.

An overcoat layer 240 may be disposed on the color filter 230 and the light-shielding pattern 220. The overcoat layer 240 may be provided not only in the display area, but also in the non-display area.

The common electrode 250 may be disposed on the overcoat layer 240. In an exemplary embodiment, the common electrode 250 may include ITO, IZO, indium oxide, zinc oxide, tin oxide, gallium oxide, titanium oxide, Al, Ag, Pt, Cr, Mo, Ta, Nb, Zn, Mg, or an alloy or deposition layer thereof, for example.

The common electrode 250 may be provided to cover the entire display area. In an exemplary embodiment, one or more slits or openings may be defined in the common electrode 250 in the display area.

The common electrode 250 may also be disposed in the non-display area, but not on the edges of the second display substrate 200 so as to expose the overcoat layer 240.

The first and second display substrates 10 and 200 may be disposed to face each other while maintaining a predetermined cell gap therebetween. The liquid crystal layer 300 may be interposed between the first and second display substrates 10 and 200. Although not specifically illustrated, an alignment layer may be disposed on at least one of the first and second display substrates 10 and 200. The pixel electrode 80 of the first display substrate 10 and the common electrode 250 of the second display substrate 200 may be disposed to face each other and may thus form an electric field together in the liquid crystal layer 300.

The wire grid polarizer substrate 102 uses a metal and may thus have a high reflection efficiency. Accordingly, the wire grid polarizer substrate 102 may even reflect already-reflected light. Therefore, the wire grid polarizer substrate 102 may transform all light into single polarized light through the recycling of reflected light. By applying the wire grid polarizer substrate 102 to the display device 1, the transmissivity and the polarization efficiency of the display device 1 may be improved, and as a result, the luminance of the display device 1 may be improved.

Although certain exemplary embodiments and implementations have been described herein, other embodiments and modifications will be apparent from this description. Accordingly, the invention is not limited to such exemplary embodiments, but rather to the broader scope of the presented claims and various obvious modifications and equivalent arrangements.

What is claimed is:
1. A wire grid polarizer, comprising:
a substrate; and
a plurality of wire patterns which is arranged on the substrate at periodic intervals and includes:
first wire patterns, which are disposed on the substrate, and one or more second wire patterns, which are disposed on one or more of the first wire patterns, each of the second wire patterns including at least one of a neutral pattern, a surface treatment pattern and first and second monomer block patterns,
wherein a portion less than all of the plurality of wire patterns each consists of the first wire pattern, the neutral pattern and the second monomer pattern.

2. The wire grid polarizer of claim 1, wherein the surface treatment pattern is disposed between the neutral pattern and one of the first and second monomer block patterns.

3. The wire grid polarizer of claim 1, wherein the surface treatment pattern is further disposed on a side of at least one neutral pattern.

4. The wire grid polarizer of claim 1, wherein the first wire patterns include metal wire patterns, which reflect light.

5. A method of fabricating a wire grid polarizer, the method comprising:
sequentially forming a metal layer, a non-selective layer and a soft layer on a substrate;
forming a soft pattern layer by patterning the soft layer;
dividing the non-selective layer into a selective area and a non-selective area by using the soft pattern layer as a mask;
applying a copolymer including two or more different monomers onto the non-selective layer; and
forming a block copolymer including first monomer blocks and second monomer blocks by annealing the copolymer such that the monomers of the copolymer are aligned,
wherein the forming the block copolymer comprises forming a first block copolymer, which is aligned in a direction parallel to a surface of the selective area and a second block copolymer, which is aligned in a direction perpendicular to a surface of the non-selective area.

6. The method of claim 5, wherein the non-selective layer includes a surface, which is divided into areas with different selectivity properties, and controls an order of alignment of the first monomer blocks and the second monomer blocks.

7. The method of claim 5, wherein the dividing the non-selective layer, comprises:
partially ashing the soft pattern layer and the non-selective layer to form a plurality of seed patterns and forming the selective area by forming a surface treatment layer on surfaces of the plurality of seed patterns; and
forming the non-selective area by washing the soft pattern layer to expose the surface of the non-selective area.

8. The method of claim 7, wherein the partially ashing the soft pattern layer and the non-selective layer comprises performing oxygen ($O_2$) plasma treatment on the soft pattern layer and the non-selective layer.

9. The method of claim 7, wherein the plurality of seed patterns is disposed in at least one of a laterally-tapered shape, a semicircular shape and a rectangular shape in a cross-sectional view.

10. The method of claim 7, wherein the surface treatment layer is hydrophilic to one of the monomers of the block copolymer.

11. The method of claim 7, wherein the surface treatment layer includes hydroxyl groups (OH—), which are disposed on the exposed surface of the non-selective layer.

12. The method of claim 7, wherein the surface treatment layer controls an order of alignment of the first monomer blocks and the second monomer blocks of the first block copolymer and the first block copolymer induces an order of alignment of the first monomer blocks and the second monomer blocks of the second block copolymer.

13. The method of claim 7, wherein the plurality of seed patterns is arranged on the surface of the non-selective layer at intervals of about 1 micrometer to about 5 micrometers.

14. The method of claim 5, wherein the non-selective layer includes at least one of a ketene-series combination, an azide-series compound and a combination thereof.

15. The method of claim 5, further comprising, after the forming the first block copolymer and the second block copolymer:
performing a first etching process of forming residual patterns by selectively removing parts of the first monomer blocks from the second block copolymer to form a height difference between the first monomer blocks and the second monomer blocks of the second block copolymer; and
performing a second etching process of removing at least one of the metal layer, the non-selective layer, the surface treatment layer, the first monomer blocks and the second monomer blocks from below the residual patterns.

16. The method of claim 15, wherein the first etching process uses a chemical reactive gas including at least one of an oxygen gas, a fluorocarbon gas, hydrogen fluoride (HF) and a chlorine (Cl) gas.

17. The method of claim 15, wherein the residual patterns cover the surface of the non-selective layer in the non-selective area.

18. The method of claim 15, wherein the second etching gas uses a non-reactive inert gas including at least one of a hydrogen (H) gas, an argon (Ar) gas, a helium (He) gas and a mixed gas thereof.

19. The method of claim 15, wherein the second etching process forms a plurality of wire patterns, including first wire patterns, which are provided by etching the metal layer, and one or more second wire patterns, which are disposed on one or more of the first wire patterns, each of the second wire patterns including at least one of a neutral pattern, which is provided by part of the non-selective layer which remains unetched, a surface treatment pattern, which is provided by part of the surface treatment layer which remains unetched, and first and second monomer block patterns, which are provided by parts of the first monomer blocks and the second monomer blocks which remain unetched.

20. A display device, comprising:
a protective layer which is disposed on a wire grid polarizer;
gate lines which are disposed on the protective layer and extend in a first direction;
data lines which are insulated from the gate lines and extend in a second direction;
thin-film transistors which are electrically connected to the gate lines and the data lines; and
pixel electrodes which are electrically connected to the thin-film transistors,
wherein the wire grid polarizer includes a plurality of wire patterns, which is disposed on a substrate to protrude and are arranged at periodic intervals, and the plurality of wire patterns includes first wire patterns, which are disposed on the substrate, and one or more second wire patterns, which are disposed on one or more of the first wire patterns, each of the second wire patterns including at least one of a neutral pattern, a surface treatment pattern and first and second monomer block patterns, wherein a portion less than all of the plurality of wire patterns each consists of the first wire pattern, the neutral pattern and the second monomer pattern.

* * * * *